(12) United States Patent
Sirinorakul

(10) Patent No.: US 8,871,571 B2
(45) Date of Patent: Oct. 28, 2014

(54) APPARATUS FOR AND METHODS OF ATTACHING HEAT SLUGS TO PACKAGE TOPS

(75) Inventor: Saravuth Sirinorakul, Bangkok (TH)

(73) Assignee: UTAC Thai Limited, Bangna Bangkok (TH)

(*) Notice: Subject to any disclaimer, the term of this patent is extended or adjusted under 35 U.S.C. 154(b) by 189 days.

(21) Appl. No.: 13/019,152

(22) Filed: Feb. 1, 2011

(65) Prior Publication Data
US 2011/0241189 A1 Oct. 6, 2011

Related U.S. Application Data

(60) Provisional application No. 61/320,652, filed on Apr. 2, 2010.

(51) Int. Cl.
| | |
|---|---|
| H01L 23/495 | (2006.01) |
| H01L 23/36 | (2006.01) |
| H01L 23/433 | (2006.01) |
| H01L 23/544 | (2006.01) |
| H01L 23/00 | (2006.01) |

(52) U.S. Cl.
CPC ............ *H01L 23/36* (2013.01); *H01L 23/4334* (2013.01); *H01L 23/544* (2013.01); *H01L 24/97* (2013.01); *H01L 2223/5442* (2013.01); *H01L 2223/54426* (2013.01); *H01L 2223/54486* (2013.01); *H01L 2224/16245* (2013.01); *H01L 2224/32245* (2013.01); *H01L 2224/48247* (2013.01); *H01L 2224/73253* (2013.01); *H01L 2224/73265* (2013.01); *H01L 2224/97* (2013.01); *H01L 2924/01029* (2013.01)
USPC .... 438/122; 257/778; 257/666; 257/E23.031; 257/741; 257/E21.237

(58) Field of Classification Search
USPC ......................... 438/122, 113, 112, 460, 107
See application file for complete search history.

(56) References Cited

U.S. PATENT DOCUMENTS

| | | | |
|---|---|---|---|
| 3,611,061 A | 10/1971 | Segerson | 317/234 R |
| 4,411,719 A | 10/1983 | Lindberg | 156/64 |
| 4,501,960 A | 2/1985 | Jouvet et al. | 235/492 |
| 4,801,561 A | 1/1989 | Sankhagowit | 437/207 |
| 4,855,672 A | 8/1989 | Shreeve | 324/158 R |
| 5,247,248 A | 9/1993 | Fukunaga | 324/158 |
| 5,248,075 A | 9/1993 | Young et al. | 228/5.1 |

(Continued)

OTHER PUBLICATIONS

Office Action mailed on Oct. 18, 2013, U.S. Appl. No. 13/333,897, filed Dec. 21, 2011, Saravuth Sirinorakul et al.

*Primary Examiner* — Chuong A Luu
*Assistant Examiner* — Rodolfo Fortich
(74) *Attorney, Agent, or Firm* — Haverstock & Owens LLP

(57) ABSTRACT

A frame includes heat slug pads coupled together in a N×M matrix such that singulation of the heat slug pads consists of one or more passes across the frame, wherein the one or more passes are parallel. A method of attaching heat slug pads to packages includes gathering a plurality of packages, preparing a heat slug frame including a N×M matrix of heat slug pads, dispensing thermally conductive material onto surfaces of the heat slug pads, attaching the plurality of packages onto the heat slug pads, and singulating the heat slug pads, wherein the singulating step consists of one or more parallel passes across the N×M matrix. A method of attaching heat slug foil to packages includes preparing a plurality of packages, laminating the heat slug foil to one side of the plurality of packages using thermally conductive material, and singulating the plurality of packages.

27 Claims, 15 Drawing Sheets

(56) References Cited

U.S. PATENT DOCUMENTS

| | | | |
|---|---|---|---|
| 5,396,185 A | 3/1995 | Honma et al. | 324/754 |
| 5,397,921 A | 3/1995 | Karnezos | 257/779 |
| 5,479,105 A | 12/1995 | Kim et al. | 324/755 |
| 5,596,231 A | 1/1997 | Combs | 257/776 |
| 5,843,808 A | 12/1998 | Karnezos | 438/121 |
| 5,990,692 A | 11/1999 | Jeong et al. | 324/755 |
| 6,072,239 A | 6/2000 | Yoneda et al. | 257/730 |
| 6,111,324 A | 8/2000 | Sheppard et al. | 257/787 |
| 6,159,770 A | 12/2000 | Tetaka et al. | 438/112 |
| 6,229,200 B1 | 5/2001 | Mclellan et al. | 257/666 |
| 6,242,281 B1 | 6/2001 | Mclellan et al. | 438/106 |
| 6,284,569 B1 | 9/2001 | Sheppard et al. | 438/110 |
| 6,285,075 B1 | 9/2001 | Combs et al. | 257/675 |
| 6,294,100 B1 | 9/2001 | Fan et al. | 216/14 |
| 6,304,000 B1 | 10/2001 | Isshiki et al. | 257/782 |
| 6,326,678 B1 | 12/2001 | Karnezos et al. | 257/666 |
| 6,329,711 B1 | 12/2001 | Kawahara et al. | 257/698 |
| 6,353,263 B1 | 3/2002 | Dotta et al. | 257/777 |
| 6,355,506 B1 * | 3/2002 | Brand | 438/122 |
| 6,376,921 B1 | 4/2002 | Yoneda et al. | 257/787 |
| 6,392,427 B1 | 5/2002 | Yang | 324/755 |
| 6,414,385 B1 | 7/2002 | Huang et al. | 257/690 |
| 6,429,048 B1 | 8/2002 | McLellan et al. | 438/108 |
| 6,451,709 B1 | 9/2002 | Hembree | 438/759 |
| 6,455,348 B1 | 9/2002 | Yamaguchi | 438/106 |
| 6,489,218 B1 | 12/2002 | Kim et al. | 438/460 |
| 6,498,099 B1 | 12/2002 | McLellan et al. | 438/689 |
| 6,507,116 B1 | 1/2003 | Caletka et al. | 257/778 |
| 6,522,545 B2 | 2/2003 | Shia et al. | |
| 6,545,332 B2 | 4/2003 | Huang | 257/433 |
| 6,545,347 B2 | 4/2003 | McClellan | 257/690 |
| 6,552,417 B2 | 4/2003 | Combs | 257/666 |
| 6,552,423 B2 | 4/2003 | Song et al. | 257/679 |
| 6,566,740 B2 | 5/2003 | Yasunaga et al. | 257/670 |
| 6,573,121 B2 | 6/2003 | Yoneda et al. | 438/106 |
| 6,585,905 B1 | 7/2003 | Fan et al. | 216/14 |
| 6,586,834 B1 | 7/2003 | Sze et al. | 257/712 |
| 6,635,957 B2 | 10/2003 | Kwan et al. | 257/691 |
| 6,667,191 B1 | 12/2003 | McLellan et al. | 438/121 |
| 6,686,667 B2 | 2/2004 | Chen et al. | 257/787 |
| 6,703,696 B2 | 3/2004 | Ikenaga et al. | 257/678 |
| 6,724,071 B2 | 4/2004 | Combs | 257/666 |
| 6,734,044 B1 | 5/2004 | Fan et al. | 438/123 |
| 6,734,552 B2 | 5/2004 | Combs et al. | 257/707 |
| 6,737,755 B1 | 5/2004 | McLellan et al. | 257/796 |
| 6,764,880 B2 | 7/2004 | Wu et al. | 438/123 |
| 6,781,242 B1 | 8/2004 | Fan et al. | 257/777 |
| 6,800,948 B1 | 10/2004 | Fan et al. | 257/783 |
| 6,812,552 B2 | 11/2004 | Islam et al. | 257/666 |
| 6,818,472 B1 | 11/2004 | Fan et al. | 438/106 |
| 6,818,978 B1 | 11/2004 | Fan | 257/686 |
| 6,818,980 B1 | 11/2004 | Pedron, Jr. | 257/706 |
| 6,841,859 B1 | 1/2005 | Thamby et al. | 257/676 |
| 6,876,066 B2 | 4/2005 | Fee et al. | 257/676 |
| 6,897,428 B2 | 5/2005 | Minamio et al. | 250/208.1 |
| 6,933,176 B1 | 8/2005 | Kirloskar et al. | 438/122 |
| 6,933,594 B2 | 8/2005 | McLellan et al. | 257/676 |
| 6,940,154 B2 | 9/2005 | Pedron et al. | 257/666 |
| 6,946,324 B1 | 9/2005 | McLellan et al. | 438/111 |
| 6,964,918 B1 | 11/2005 | Fan et al. | 438/614 |
| 6,967,126 B2 | 11/2005 | Lee et al. | 438/122 |
| 6,979,594 B1 | 12/2005 | Fan et al. | 438/113 |
| 6,982,491 B1 | 1/2006 | Fan et al. | 257/778 |
| 6,984,785 B1 | 1/2006 | Diao et al. | 174/52.2 |
| 6,989,294 B1 | 1/2006 | McLellan et al. | 438/111 |
| 6,995,460 B1 | 2/2006 | McLellan et al. | 257/676 |
| 7,008,825 B1 | 3/2006 | Bancod et al. | 438/123 |
| 7,009,286 B1 | 3/2006 | Kirloskar et al. | 257/684 |
| 7,049,177 B1 | 5/2006 | Fan et al. | 438/123 |
| 7,060,535 B1 | 6/2006 | Sirinorakul et al. | 438/123 |
| 7,071,545 B1 | 7/2006 | Patel et al. | 257/686 |
| 7,091,581 B1 | 8/2006 | McLellan et al. | 257/673 |
| 7,101,210 B2 | 9/2006 | Lin et al. | 439/331 |
| 7,102,210 B2 | 9/2006 | Ichikawa | 257/666 |
| 7,205,178 B2 | 4/2007 | Shiu et al. | 438/110 |
| 7,224,048 B1 | 5/2007 | McLellan et al. | 257/678 |
| 7,247,526 B1 | 7/2007 | Fan et al. | 438/123 |
| 7,274,088 B2 | 9/2007 | Wu et al. | 257/673 |
| 7,314,820 B2 | 1/2008 | Lin et al. | 438/617 |
| 7,315,080 B1 | 1/2008 | Fan et al. | 257/717 |
| 7,342,305 B1 | 3/2008 | Diao et al. | 257/706 |
| 7,344,920 B1 | 3/2008 | Kirloskar et al. | 438/123 |
| 7,348,663 B1 | 3/2008 | Kirloskar et al. | 257/704 |
| 7,358,119 B2 | 4/2008 | McLellan et al. | 438/127 |
| 7,371,610 B1 | 5/2008 | Fan et al. | 438/112 |
| 7,372,151 B1 | 5/2008 | Fan et al. | 257/738 |
| 7,381,588 B1 | 6/2008 | Patel et al. | 438/109 |
| 7,399,658 B2 | 7/2008 | Shim et al. | 438/106 |
| 7,408,251 B2 | 8/2008 | Hata et al. | 257/678 |
| 7,411,289 B1 | 8/2008 | McLellan et al. | 257/700 |
| 7,449,771 B1 | 11/2008 | Fan et al. | 257/676 |
| 7,482,690 B1 | 1/2009 | Fan et al. | 257/724 |
| 7,595,225 B1 | 9/2009 | Fan et al. | 438/112 |
| 7,714,418 B2 | 5/2010 | Lim et al. | 257/670 |
| 2002/0109214 A1 | 8/2002 | Minamio et al. | |
| 2003/0013340 A1 * | 1/2003 | Martin et al. | 439/488 |
| 2003/0045032 A1 | 3/2003 | Abe | 438/123 |
| 2003/0071333 A1 | 4/2003 | Matsuzawa | 257/676 |
| 2003/0143776 A1 | 7/2003 | Pedrron, Jr. et al. | 438/106 |
| 2003/0178719 A1 | 9/2003 | Combs et al. | 257/704 |
| 2003/0201520 A1 | 10/2003 | Knapp et al. | 257/666 |
| 2003/0207498 A1 | 11/2003 | Islam et al. | 438/120 |
| 2004/0014257 A1 | 1/2004 | Kim et al. | 438/111 |
| 2004/0046237 A1 | 3/2004 | Abe et al. | 257/676 |
| 2004/0046241 A1 | 3/2004 | Combs et al. | 257/678 |
| 2004/0070055 A1 | 4/2004 | Punzalan et al. | |
| 2004/0080025 A1 | 4/2004 | Kasahara et al. | 257/666 |
| 2004/0110319 A1 | 6/2004 | Fukutomi et al. | 438/106 |
| 2005/0003586 A1 | 1/2005 | Shimanuki et al. | 438/124 |
| 2005/0077613 A1 | 4/2005 | McLellan et al. | 257/706 |
| 2005/0161806 A1 | 7/2005 | Divakar et al. | |
| 2005/0236701 A1 | 10/2005 | Minamio et al. | |
| 2006/0071351 A1 | 4/2006 | Lange | |
| 2006/0192295 A1 | 8/2006 | Lee et al. | 257/778 |
| 2006/0223229 A1 | 10/2006 | Kirloskar et al. | 438/106 |
| 2006/0223237 A1 * | 10/2006 | Combs et al. | 438/122 |
| 2006/0273433 A1 | 12/2006 | Itou et al. | 257/666 |
| 2007/0001278 A1 | 1/2007 | Jeon et al. | 257/676 |
| 2007/0145558 A1 * | 6/2007 | Chia et al. | 257/678 |
| 2007/0200210 A1 | 8/2007 | Zhao et al. | 257/676 |
| 2007/0235217 A1 | 10/2007 | Workman | 174/260 |
| 2008/0048308 A1 | 2/2008 | Lam | 257/686 |
| 2008/0150094 A1 | 6/2008 | Anderson | 257/659 |

* cited by examiner

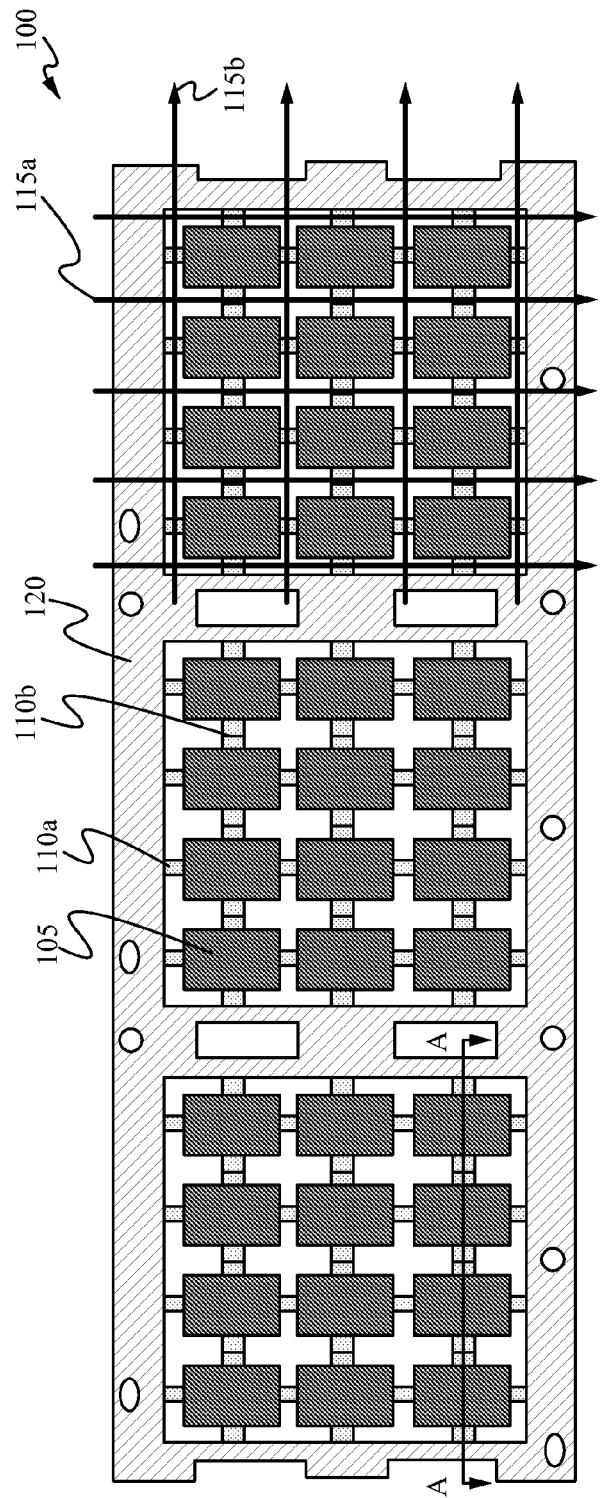
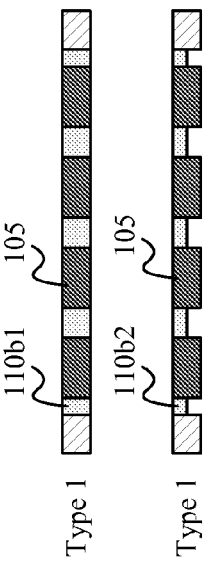
Fig. 1A (Prior Art)
Fig. 1B (Prior Art)

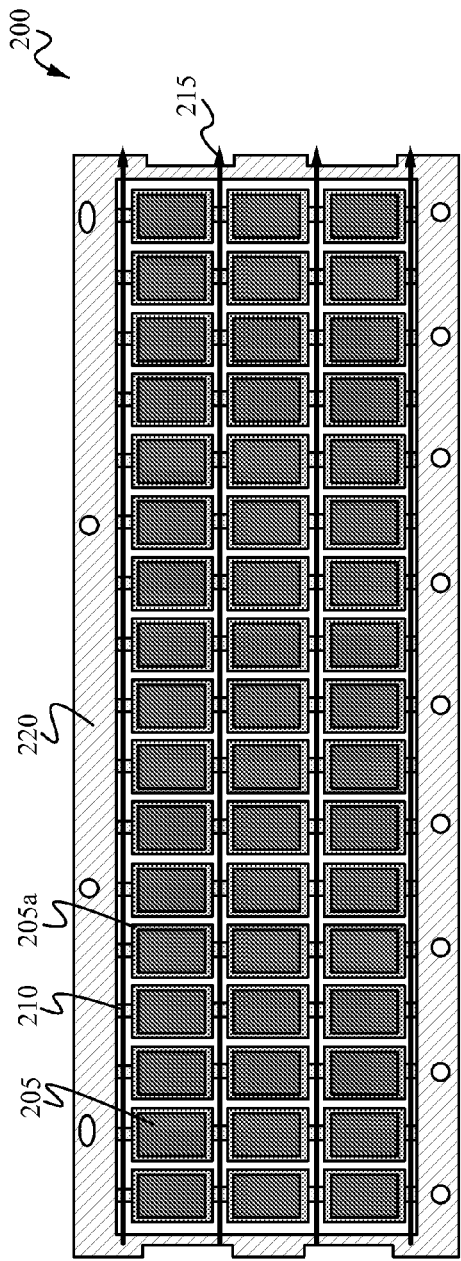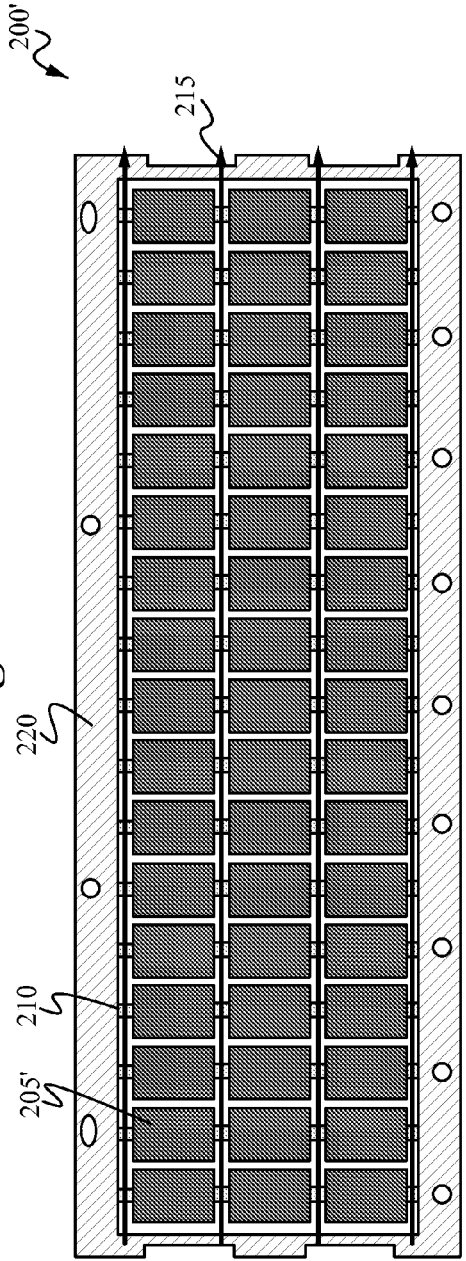

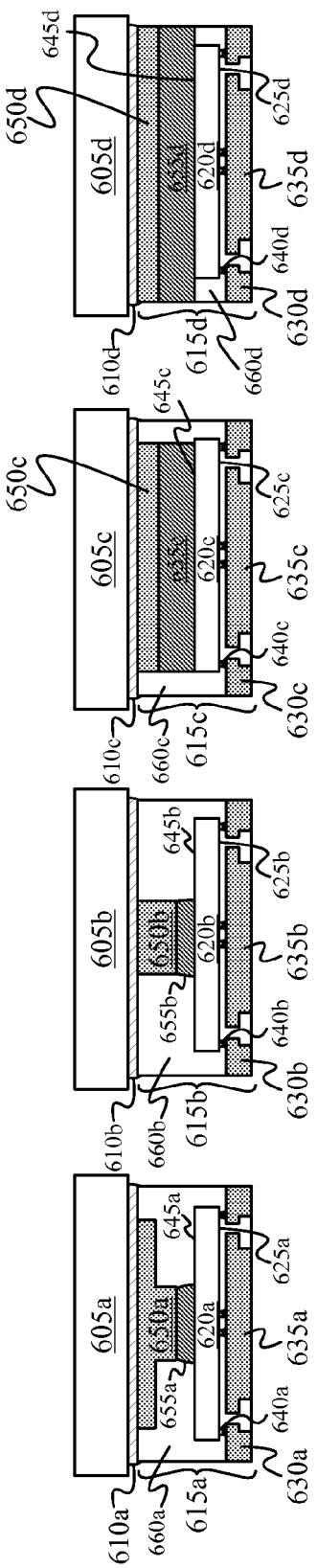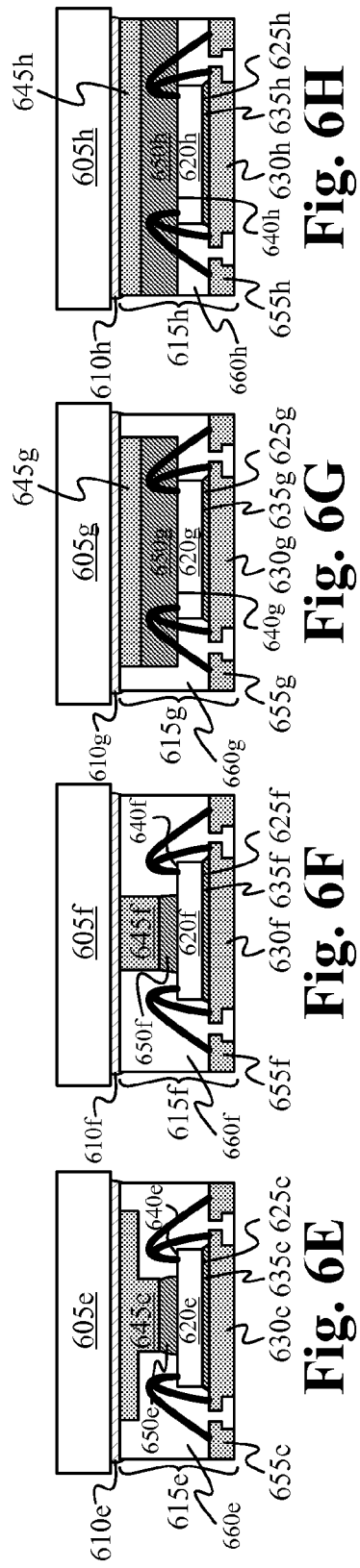

APPARATUS FOR AND METHODS OF ATTACHING HEAT SLUGS TO PACKAGE TOPS

RELATED APPLICATIONS

This application claims benefit of priority under 35 U.S.C. section 119(e) of the U.S. Provisional Patent Application Ser. No. 61/320,652, filed Apr. 2, 2010, entitled "PACKAGE WITH Heat slug pad," which is hereby incorporated by reference in its entirety.

FIELD OF THE INVENTION

The present invention is related to the field of semiconductor device manufacturing. More specifically, the present invention relates to an apparatus for and methods of attaching heat slugs to package tops.

BACKGROUND

A heat slug leadframe provides mechanical support to semiconductor packages during assembly into finished products. FIG. 1A illustrates a prior art heat slug leadframe 100. The heat slug leadframe 100 has a N×M matrix of heat slug pads 105 coupled together or to the frame 120 using tie bars 110a, 110b. As illustrated, the tie bars 110a, 110b couple vertically and horizontally adjacent heat slug pads 105 together. In particular, each heat slug pad uses tie bars 110a, 110b on all sides of the heat slug pad to couple to other heat slug pads 105 and/or to the frame 120. Vertical and horizontal cuts 115a, 115b across the matrix during singulation are thus needed to separate the heat slug pads 105 from each other and the frame. Due to the time required to take the multiple passes (i.e., vertical passes and horizontal passes) across the matrix for singulation, the prior art leadframe 100 therefore has a low units per hour (UPH) output value. Further, the required passes across the matrix not only causes high blade wear, but singulating the heat slug pads 105 with packages (not illustrated) coupled thereto has a high potential of cracking or chipping these packages. These cracked or chipped packages are unusable. Such damages can become costly.

FIG. 1B illustrates a cross section view along the line A-A of the prior heat slug leadframe of FIG. 1A. There are two types of tie bars. The first type of tie bar 110b1 is not etched and has the same thickness as a heat slug pad 105. The second type of tie bar 110b2 is etched and has, for example, half the thickness as a heat slug pad 105 to help reduce or minimize blade wear. However, a heat slug leadframe having the second type of tie bar 110b2 has the same disadvantage as a heat slug leadframe having the first type of tie bar 110b1 in that it has a low UPH and a high potential of damaging the packages coupled thereto due to the required multiple passes across the matrix of heat slug pads for singulation. What is needed is a leadframe that requires less passes across the leadframe during singulation to reduce or minimize blade wear and/or the potential of cracking or chipping packages thereon.

SUMMARY OF THE DISCLOSURE

The term "heat slug" refers to either a heat slug pad or heat slug foil. However, it should be apparent from the disclosure how the term "heat slug" is used.

In one aspect, a frame includes heat slug pads that are coupled together in a N×M matrix such that singulation of the heat slug pads consists of one or more parallel passes across the frame. The thickness of each heat slug pad is typically between 0.02 mm and 1.0 mm. Each heat slug pad is coupled to another heat slug pad using one or more tie bars. In some embodiments, each heat slug pad has one or more tie bars on each non-adjacent side of the heat slug pad. The one or more tie bars in some embodiments do not have the same thickness as the heat slug pads. In some embodiments, the thickness of a tie bar is smaller than the thickness of a heat slug pad. In some embodiments, the tie bars are etched or stamped. In some embodiments, each heat slug pad includes one or more fiducial alignment marks to aid placement of a package onto the heat slug pad. The heat slug pad can be etched or stamped to obtain a desired form. In some embodiments, at least a portion of the heat slug pad is half the total thickness of the heat slug pad. In some embodiments, the heat slug pad includes a protrusion along a portion of the heat slug pad. The protrusion extends between 0.1 mm and 0.2 mm from an edge of the package coupled to the heat slug. The protrusion advantageously minimizes blade wear and prevents chips and/or cracks to the package because the protrusion provides for enough spacing between the package and the singulation device. In some embodiments, the heat slug pad includes at least two walls to position the package therebetween when the package is coupled to the heat slug. In some embodiments, the heat slug pads comprise copper or a metal alloy.

In another aspect, a method is directed to attaching heat slug pads to packages. A plurality of packages is gathered. The packages are typically singulated. In some embodiments, the packages are wafer level chip scale packages, flip-chip quad flat non-lead packages or wire-bond quad flat non-lead packages. Other packages are contemplated.

A heat slug frame is then prepared. Typically, the heat slug frame includes a N×M matrix of heat slug pads coupled together. In some embodiments, the heat slug pads are formed by etching or stamping such that a protrusion is created along a portion of each heat slug pad. The protrusion typically extends between 0.1 mm and 0.2 mm from an edge of a package coupled to the heat slug. In some embodiments, the heat slug pads formed such that each heat slug pad includes at least two walls to position the package therebetween. At least a portion of the heat slug pad is half the total thickness of the heat slug pad. In some embodiments, the heat slug pads are marked with fiducial alignment marks to aid placement of the package onto the heat slug pad. The etching or stamping of the heat slug pads advantageously minimizes blade wear and prevents chips and/or cracks to packages. Each heat slug pad is typically coupled to another heat slug pad using one or more tie bars. In some embodiments, each heat slug pad has one or more tie bars on each non-adjacent side of the heat slug pad. The one or more tie bars in some embodiments are etched. Alternatively, the one or more tie bars are stamped.

Thermally conductive material is then dispensed onto surfaces of the heat slug pads. The plurality of packages is attached onto the heat slug pads. If fiducial alignment marks exist on the heat slug pads, then the marks are used to align the plurality of packages to the heat slug pads according to fiducial alignment marks on the heat slug pads. After placing the packages on the heat slug pads, the thermally conductive material is cured. The heat slug pads (with the packages thereon) are singulated. Typically, singulation consists of one or more passes across the N×M matrix, wherein the one or more passes are parallel.

Yet in another aspect, a method is directed to attaching heat slug foil to packages. A plurality of packages is prepared. Typically, the prepared packages are not singulated. In some embodiments, the packages are wafer level chip scale packages, flip-chip quad flat non-lead packages or wire-bond quad flat non-lead packages. Other packages are contemplated.

Heat slug foil is then laminated to one side of the packages using thermally conductive material. The thermally conductive material is cured. After the thermally conductive material is cured, the plurality of packages is singulated.

Yet in another aspect, a method is directed to forming a heat slug leadframe. A heat slug leadframe is first obtained. Typically, the heat slug leadframe includes at least one heat slug pad and one or more tie bars on each non-adjacent side of the at least one heat slug pad. The heat slug pad is prepared such that the heat slug pad has varying thickness across the heat slug pad. The heat slug pad is further formed to obtain a desired design. The heat slug pad is formed by etching. Alternatively, the heat slug pad is formed by stamping. In some embodiments, the prepared heat slug pad includes a protrusion along a portion of the heat slug pad. Alternatively or in addition to, the prepared heat slug pad includes at least two walls configured to position a package therebetween when the package is coupled to the heat slug pad. In some embodiments, the heat slug pad is further marked with one or more fiducial alignment marks. In some embodiments, the one or more tie bars are formed. The one or more tie bars are formed by etching. Alternatively, the one or more tie bars are formed by stamping.

BRIEF DESCRIPTION OF THE DRAWINGS

The novel features of the invention are set forth in the appended claims. However, for purpose of explanation, several embodiments of the invention are set forth in the following figures.

FIG. 1A illustrates a prior art heat slug leadframe.

FIG. 1B illustrates a cross section view of the line A-A in FIG. 1B.

FIGS. 2A-2B illustrate two embodiments of a heat slug leadframe in accordance with the present invention.

FIGS. 6A-6H illustrate representative packages in accordance with the present invention.

DETAILED DESCRIPTION

Figures 2C, 2D:
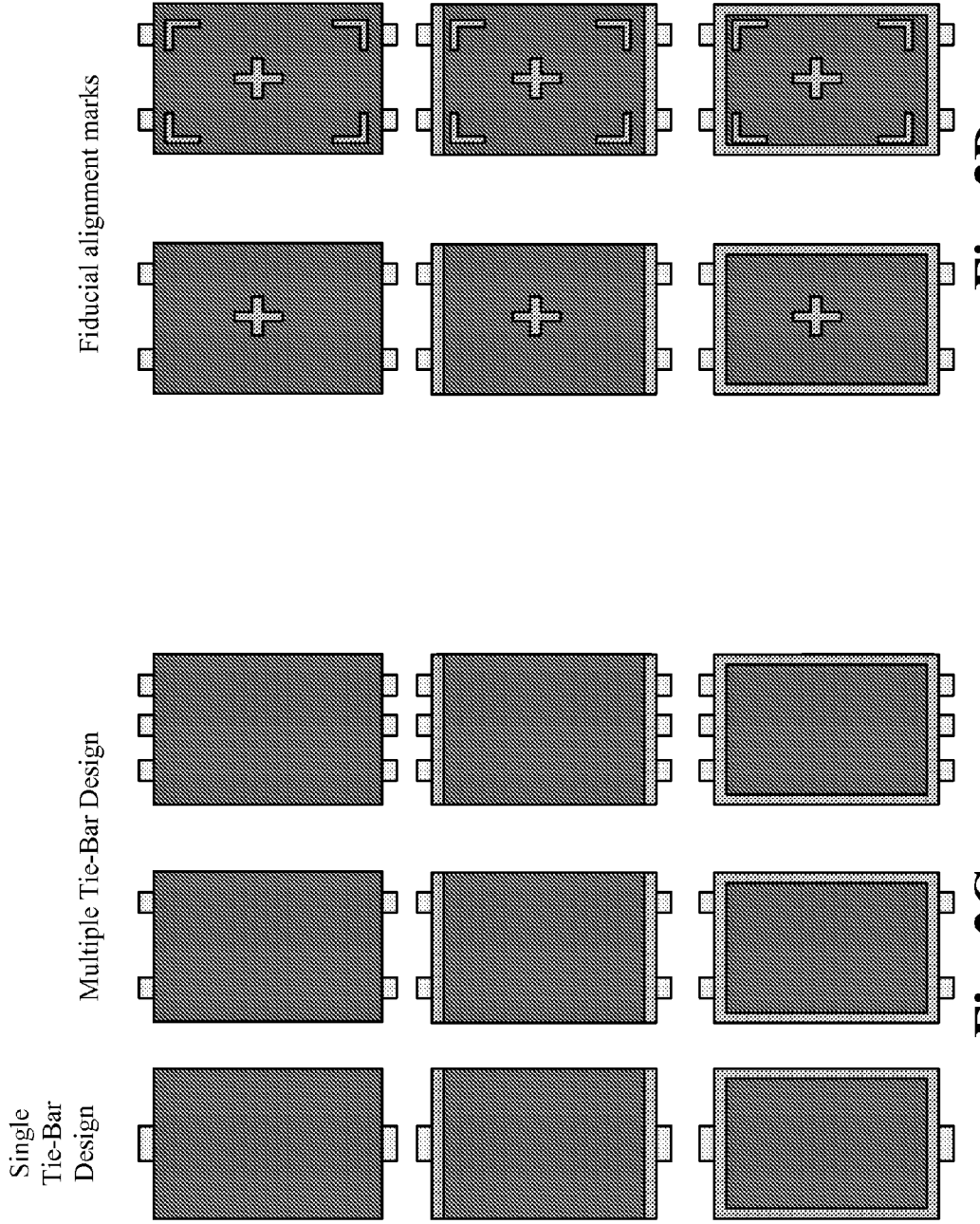
FIG. 2C illustrates various embodiments of tie bar designs in accordance with the present invention.
FIG. 2D illustrates various embodiments of physical fiducial alignment mark designs in accordance with the present invention.

In the following description, numerous details are set forth for purposes of explanation. However, one of ordinary skill in the art will realize that the invention can be practiced without the use of these specific details. Thus, the present invention is not intended to be limited to the embodiments shown but is to be accorded the widest scope consistent with the principles and features described herein or with equivalent alternatives.

Reference will now be made in detail to implementations of the present invention as illustrated in the accompanying drawings. The same reference indicators will be used throughout the drawings and the following detailed description to refer to the same or like parts.

Embodiments of the present invention are directed to an apparatus for and methods of attaching heat slugs to package tops. The term "heat slug" refers to either a heat slug pad or heat slug foil, each of which is described below. It should be apparent from the disclosure how the term "heat slug" is used.

Heat Slug Pads

In some embodiments, the apparatus is a frame comprising heat slug pads coupled together in a N×M matrix such that singulation of the heat slug pads consists of one or more passes across the frame, wherein the one or more passes are parallel. As is evidenced herein, the frame according to the present invention advantageously saves material costs and production time, and reduces the potential of damaging the heat slug pads and/or packages thereon during singulation.

FIG. 2A illustrates one embodiment of a heat slug leadframe 200 in accordance with the present invention. The heat slug leadframe 200 typically comprises a N×M matrix of heat slug pads 205. As illustrated, the heat slug pads 205 in the $m^{th}$ position or column of each row in the matrix are coupled together using tie bars 210. Unlike the prior art heat slug pads 105 of FIG. 1A, each heat slug pad 205 of the present invention has tie bars only on non-adjacent sides of the heat slug pad 205 to couple to other heat slug pads and/or to the frame 220 such that only one or more parallel passes 215 are needed during singulation to separate the heat slug pads 205. Put differently, the heat slug pads 205 are coupled to other heat slug pads 205 in adjacent row or adjacent columns, but not both. Since the number of passes during singulation is greatly reduced (as compared to that in the prior art), blade wear is significantly reduced.

In some embodiments, the tie bars 210 are etched to further minimize blade wear and/or reduce package chips/cracks during singulation. Alternatively, the tie bars 210 are stamped to minimize blade wear and/or reduce package chips/cracks during singulation. Similar to that illustrated in FIG. 1B, the tie bars 210 do not have the same thickness as the heat slug pads 205.

In some embodiments, each heat slug pad 205 is also etched to obtain a desired from of the heat slug pads 205. As illustrated in FIGS. 2A and 2C-2D (bottom rows), the circumference of each heat slug pad 205 is etched. Alternatively, only the sides of where the tie bars are coupled to on the heat slug pads 205 are etched (FIGS. 2C and 2D, second rows). Alternatively, the centers of the heat slug pads 205 etched (FIGS. 4F and 4N). Alternatively, both top and bottom of the heat slug pad 205 are etched to create, for example, a middle protrusion (FIGS. 4E and 4I-4J). In other embodiments, heat slug pads 205 can be stamped to obtain the desired form of the heat slug pads 205. Both the etching process and the stamping process not only "cut" but also "form" different thicknesses of the heat slug leadframe 200.

FIG. 2B illustrates another embodiment of a heat slug leadframe 200' in accordance with the present invention. The heat slug leadframe 200' is similarly configured as the heat slug leadframe 200; however, the heat slug pads 205' are not etched or stamped. These non-formed heat slug pads are also shown in FIGS. 2C-2D (top rows).

In some embodiments, the thickness of the heat slug pads is approximately between 0.02 mm and 1.0 mm, although other thicknesses are contemplated. Typically, the heat slug pads are made from copper, although other metal alloys are contemplated.

Although a single tie per side is illustrated in FIGS. 2A-2B, multiple tie bars per side can be used, for example, with larger heat slug pads. FIG. 2C illustrates various embodiments of tie bar designs in accordance with the present invention. All embodiments of the heat slug pads include tie bars on only non-adjacent sides of each heat slug pad so as to reduce the number of passes across the heat slug lead frame during singulation. In particular, a heat slug pad has one or more tie bars on each of the two, opposite sides of the heat slug pad so as to couple to other heat slug pads either vertically or horizontally, but not both. In some embodiment, only one pair of tie bars is coupled to the non-adjacent sides. (A "pair" is defined as two tie bars; one tie bar on one side, and the other tie bar on the opposite side.) In other embodiments, multiple pairs of tie bars are coupled to the non-adjacent sides. Multiple pairs of tie bars can be used with larger heat slug pads to securely couple the larger heat slug pads to the frame 220. Although FIG. 2C illustrates three patterns of the heat slug pads (first row heat slug pads are not formed by etching or stamping; second row heat slug pads formed by etching or stamping such that portions along two non-adjacent sides of the heat slug pads are removed; third or last row heat slug pads are formed by etching or stamping such that portions around the circumferences of the heat slug pads are removed), other patterns of the heat slug pads are contemplated.

In some embodiments, heat slug pads have optical or physical fiducial alignment marks on the surfaces of the heat slug pads. Fiducial alignment marks provide reference points for high precision alignment of attaching packages to the heat slug pads. Fiducial alignment marks advantageously decrease the time needed to locate accurate placement of the packages.

FIG. 2D illustrates various embodiments of physical fiducial alignment mark designs in accordance with the present invention. As illustrated, some embodiments have a cross marking at the center, while other embodiments have both a cross marking and corner markings. While only two mark designs are shown, other mark designs are contemplated. Typically, fiducial alignment markings vary depending on the shape of the package and/or the attachment equipment capability.

The heat slug leadframes 200, 200' of the present invention advantageously reduce the number of passes required to separate the heat slug pads 205, 205' from each other and/or the frame 220. As such, the heat slug leadframes 200, 200' have a higher units per hour (UPH) output value than that of prior art leadframe 100. The reduced number of passes across the matrix during singulation minimizes blade wear and/or reduces the potential of cracking or chipping the packages coupled thereon.

Figure 3A:
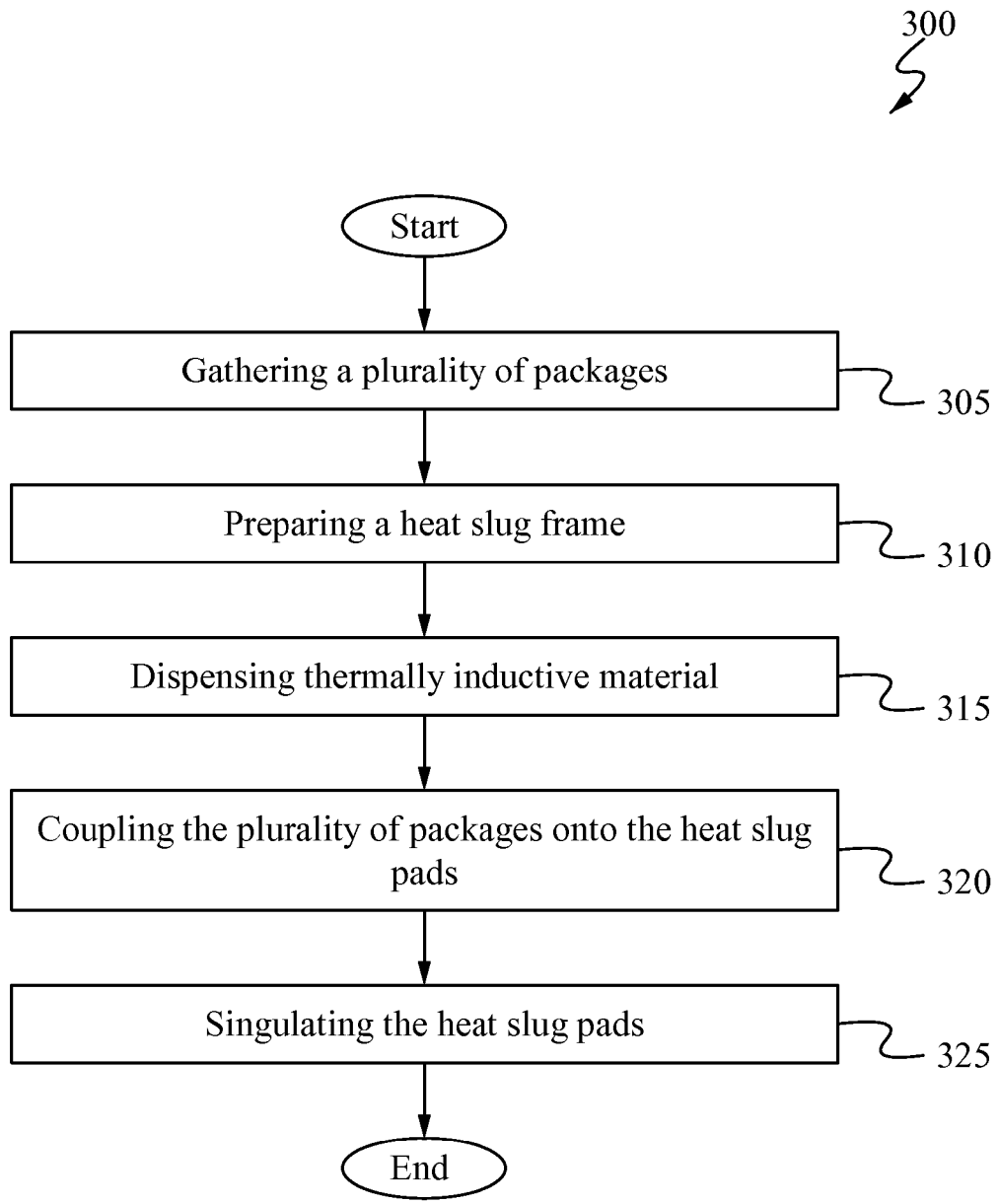
FIG. 3A illustrates a method of attaching heat slug pads to packages in accordance with the present invention.

FIG. 3A illustrates an embodiment of a method 300 of attaching heat slug pads to packages in accordance with the present invention. The method 300 begins at a step 305, wherein a plurality of packages is gathered. In some embodiments, the gathering step includes singulating the plurality of packages from a wafer, a strip or the like. At a step 310, a heat slug frame comprising a N×M matrix of heat slug pads is prepared (as in FIGS. 2A-2B). In some embodiments, the preparing step includes etching or stamping the heat slug pads, the tie bars, or both. At a step 315, thermally conductive material is dispensed onto the surfaces of the heat slug pads. At a step 320, the plurality of packages is coupled to the heat slug pads with the thermally conductive material therebetween. At a step 325, the heat slug pads having the plurality of packages thereon are singulated via, for example, saw singulation, laser singulation or punch singulation. Typically, the singulating step consists of one or more passes across the N×M matrix, wherein the one or more passes are parallel. The method 300 thereafter ends.

Figure 3B:
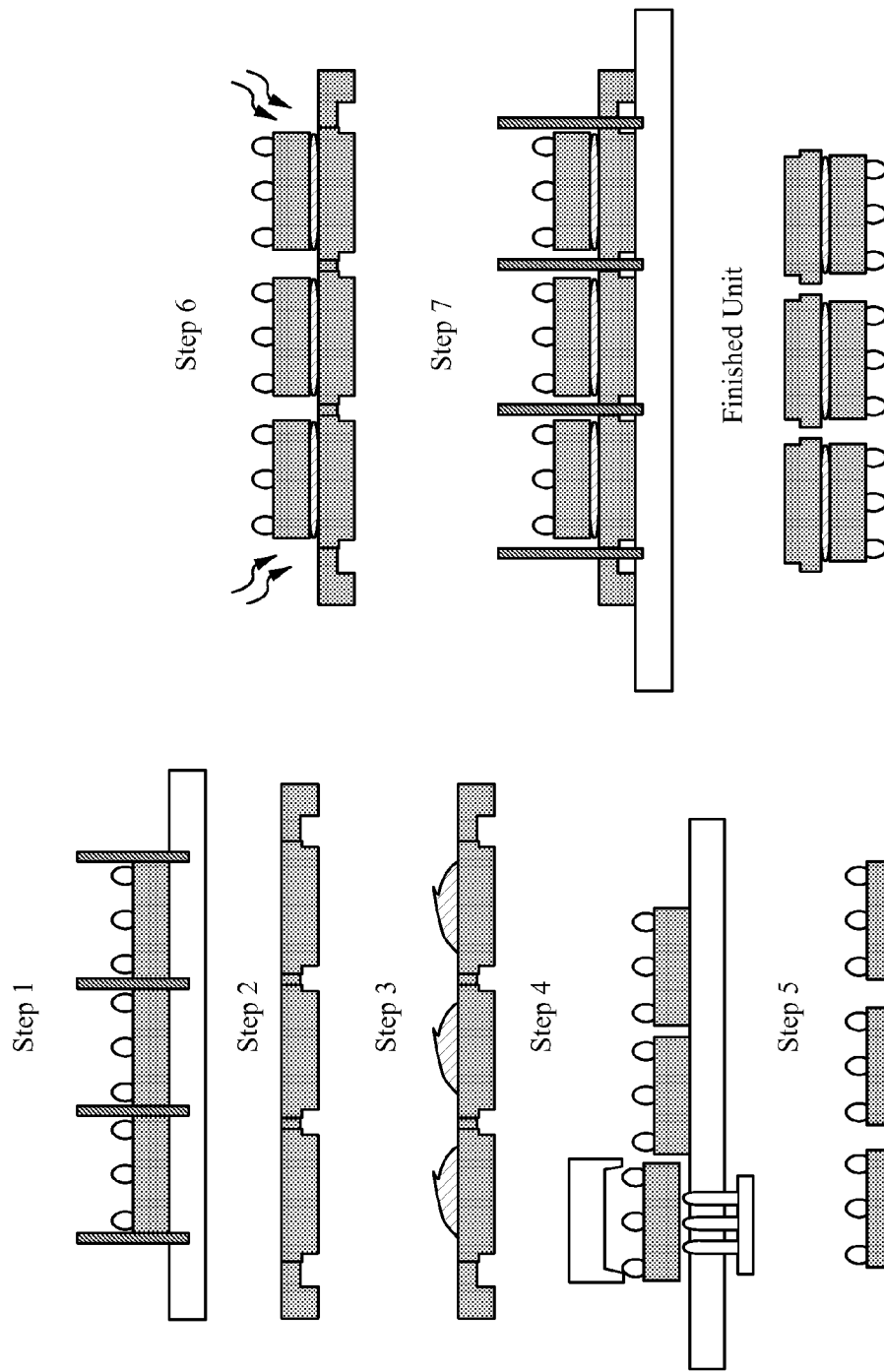
FIG. 3B illustrates a graphical process of producing WLCSPs (wafer level chip scale packages) with attached heat slug pads in accordance with the present invention.

FIG. 3B illustrates an embodiment of a graphical process of producing WLCSPs (wafer level chip scale packages) with attached heat slug pads in accordance with the present invention. At a step 1, singulated WLCSPs from a wafer are gathered. At a step 2, a heat slug frame is prepared. The heat slug frame can be optionally etched or stamped depending on application. As illustrated, the both the heat slug pads and the tie bars are etched or stamped. However, in other embodiments, neither the tie bars, the heat slug pads, nor both are etched or stamped. Heat slug pads are typically coupled to other heat slug pads using tie bars. Preferably, heat slug pads include one or more pairs of tie bars on only non-adjacent sides of the heat slug pads such that singulation of the heat slug pads requires only one or more parallel passes. At a step 3, thermally conductive material is dispensed onto the heat slug pads. At a step 4, the WLCSPs are picked up and are coupled to the heat slug pads at a step 5. In particular, the heat slug pads are coupled to the passive side of the WLCSPs. At a step 6, the thermally conductive material is cured. At a step 7, the heat slug pads with the packages coupled thereto are singulated using parallel passes, resulting in WLCSPs with attached heat slug pads. As illustrated, a finished product has a heat slug pad coupled to the package. The width of the interfacing planar surface of the heat slug pad is greater than the width of the exposed planer surface of the heat slug pad and the width of the attached package. This extended interfacing planar surface advantageously reduces the potential of damaging the heat slug pad and of cracking or chipping the package during singulation because the protrusion provides for enough spacing between the package and the singulation device to avoid damage to the package.

Figure 3C:
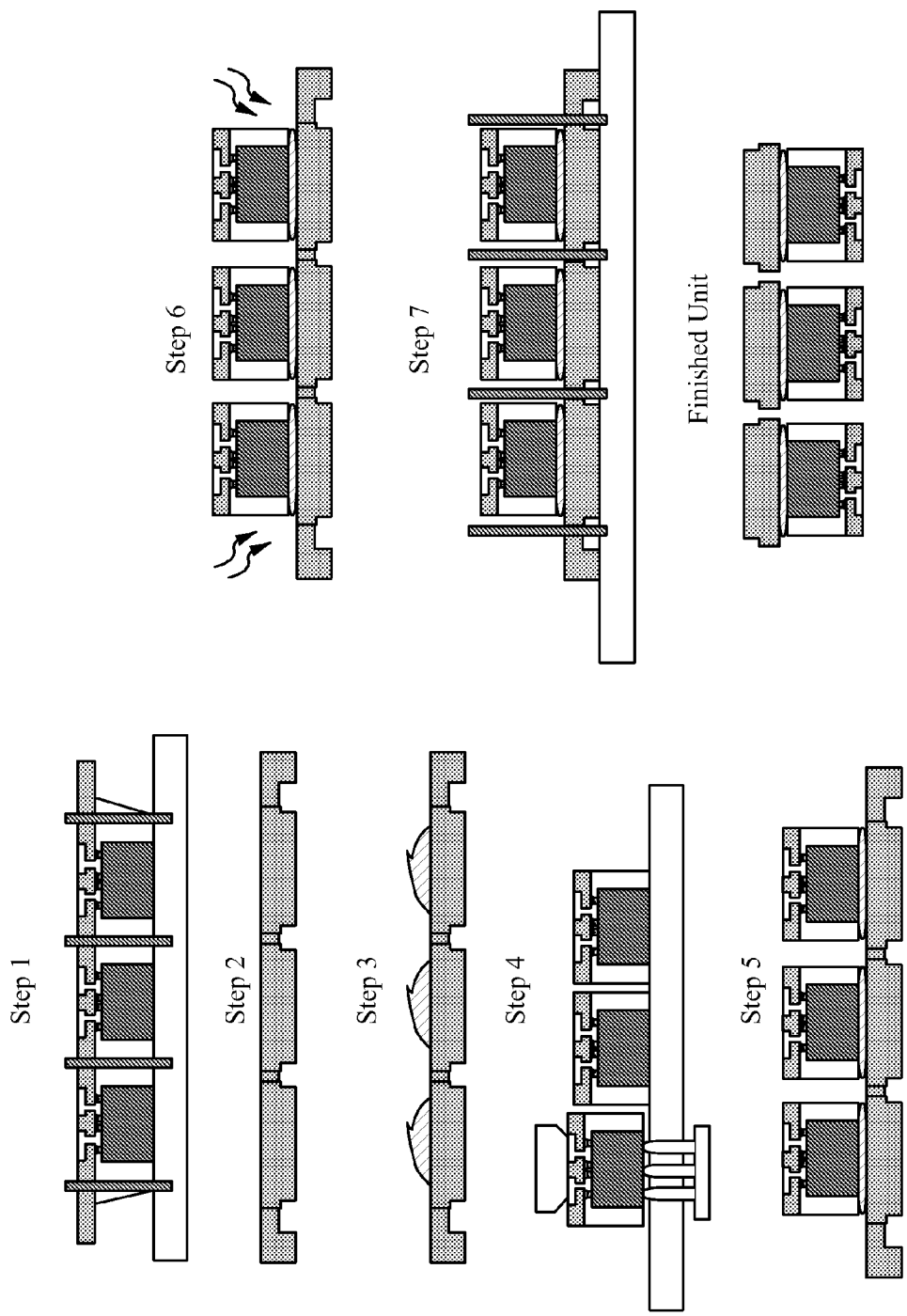
FIG. 3C illustrates a graphical process of producing FC-QFN (flip-chip quad flat non-lead) packages with attached heat slug pads in accordance with the present invention.

FIG. 3C illustrates an embodiment of a graphical process of producing FC-QFN (flip-chip quad flat non-lead) packages with attached heat slug pads in accordance with the present invention. At a step 1, a FC-QFN packages from a molded strip are gathered. At a step 2, a heat slug frame is prepared. The heat slug frame can be optionally etched or stamped depending on application. As illustrated, the both the heat slug pads and the tie bars are etched or stamped. However, in other embodiments, neither the tie bars, the heat slug pads, nor both are etched or stamped. Heat slug pads are typically coupled to other heat slug pads using tie bars. Preferably, heat slug pads include one or more pairs of tie bars on only non-adjacent sides of the heat slug pads such that singulation of the heat slug pads requires only one or more parallel passes. At a step 3, thermally conductive material is dispensed onto the heat slug pads. At a step 4, the FC-QFN packages are picked up and are coupled to the heat slug pads at a step 5. In particular, the heat slug pads are coupled to the passive side of the FC-QFN packages. At a step 6, the thermally conductive material is cured. At a step 7, the heat slug pads with the packages coupled thereto are singulated using parallel passes, resulting in FC-QFN packages with attached heat slug pads. As illustrated, a finished product has a heat slug pad coupled to the package. The width of the interfacing planar surface of the heat slug pad is greater than the width of the exposed planer surface of the heat slug pad and the width of the attached package. This extended interfacing planar surface advantageously reduces the potential of damaging the heat slug pad and of cracking or chipping the package during singulation because the protrusion provides for enough spacing between the package and the singulation device to avoid damage to the package.

Figure 3D:
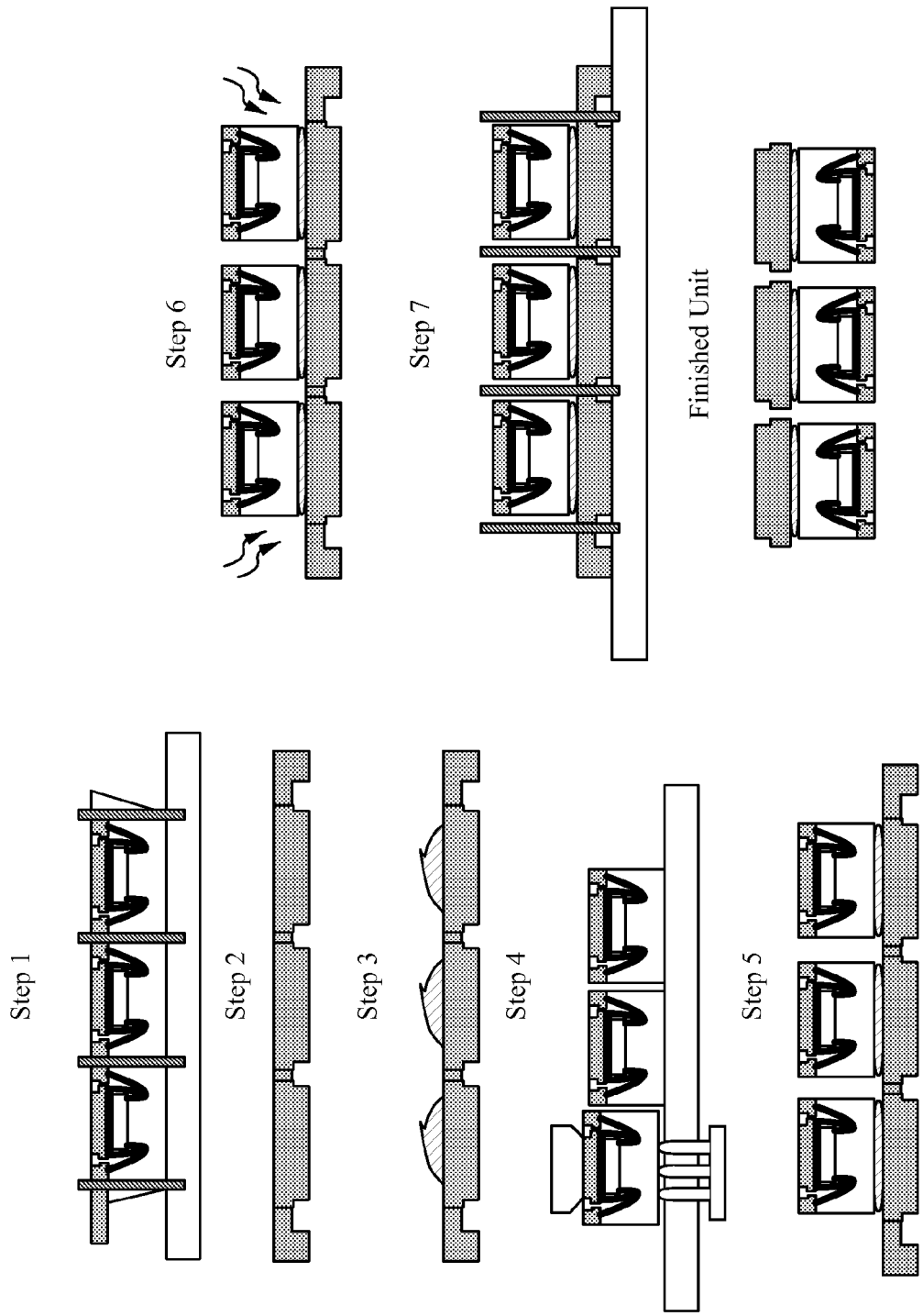
FIG. 3D illustrates a graphical process of producing WB-QFN (wire-bond quad flat non-lead) packages with attached heat slug pads in accordance with the present invention.

FIG. 3D illustrates an embodiment of a graphical process of producing WB-QFN (wire-bond quad flat non-lead) packages with attached heat slug pads in accordance with the present invention. At a step 1, a WB-QFN packages from a molded strip are gathered. At a step 2, a heat slug frame is prepared. The heat slug frame can be optionally etched or stamped depending on application. As illustrated, the both the heat slug pads and the tie bars are etched or stamped. However, in other embodiments, neither the tie bars, the heat slug pads, nor both are etched or stamped. Heat slug pads are typically coupled to other heat slug pads using tie bars. Preferably, heat slug pads include one or more pairs of tie bars on only non-adjacent sides of the heat slug pads such that singulation of the heat slug pads requires only one or more parallel passes. At a step 3, thermally conductive material is dispensed onto the heat slug pads. At a step 4, the WB-QFN packages are picked up and are coupled to the heat slug pads at a step 5. In particular, the heat slug pads are coupled to the active side of the WB-QFN packages. At a step 6, the thermally conductive material is cured. At a step 7, the heat slug pads with the packages coupled thereto are singulated using parallel passes, resulting in WB-QFN packages with attached heat slug pads. As illustrated, a finished product has a heat slug pad coupled to the package. The width of the interfacing planar surface of the heat slug pad is greater than the width of the exposed planer surface of the heat slug pad and the width of the attached package. This extended interfacing planar surface advantageously reduces the potential of damaging the heat slug pad and of cracking or chipping of the package during singulation because the protrusion provides for enough spacing between the package and the singulation device to avoid damage to the package.

Although the processes of producing WLCSPs, FC-QFN packages and WB-QFN packages with attached heat slug pads are discussed in FIGS. 3B-3D, other types of packages can be coupled to the heat slug pads according to method 300. Other exemplary types of packages are discussed below.

Figure 4A:
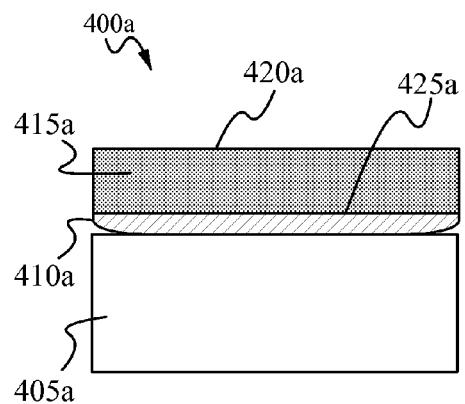
FIGS. 4A-4N illustrate different embodiments of the heat slug pads in accordance with the present invention.
Figure 4B:
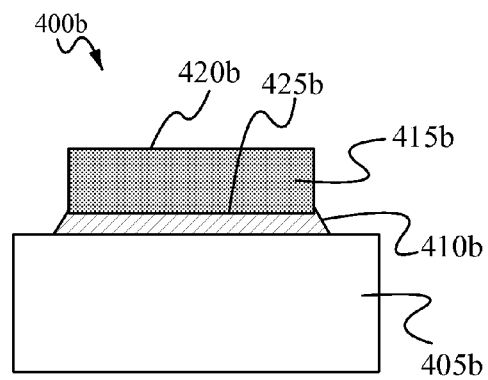
Figure 4C:
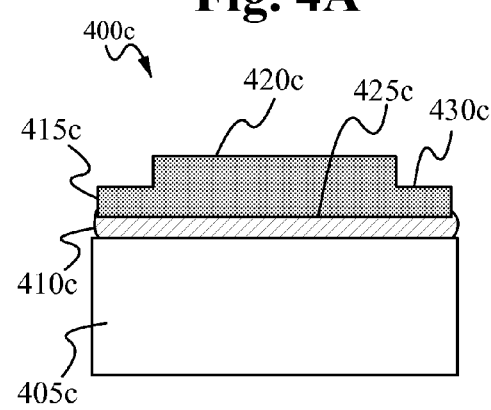
Figure 4D:
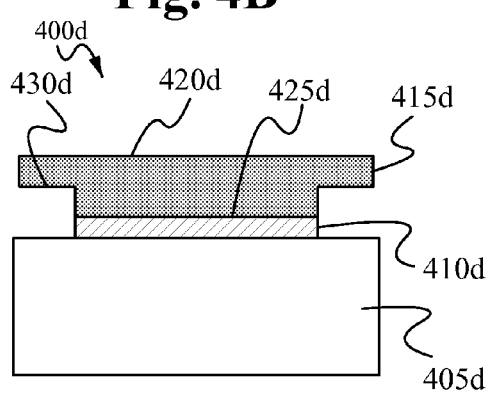
Figure 4E:
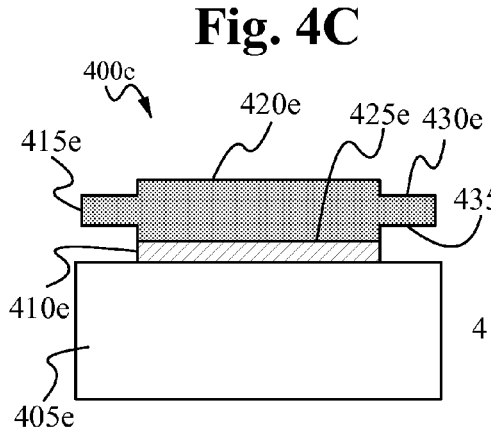
Figure 4F:
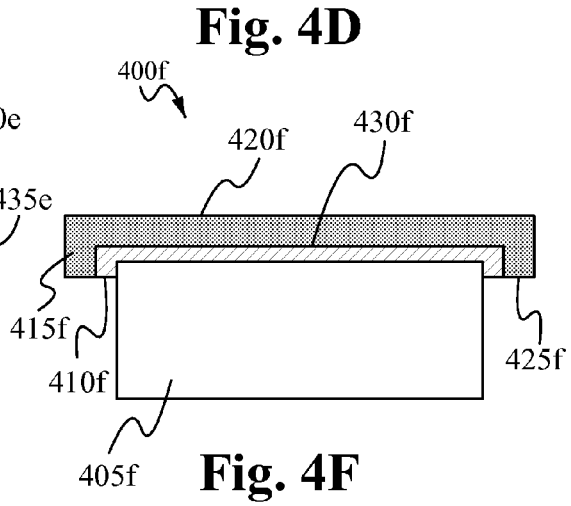
Figure 4G:
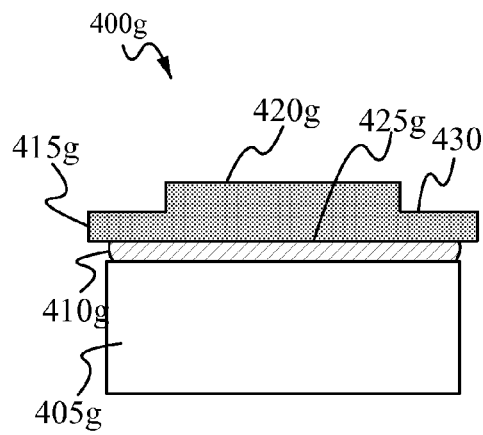
Figure 4H:
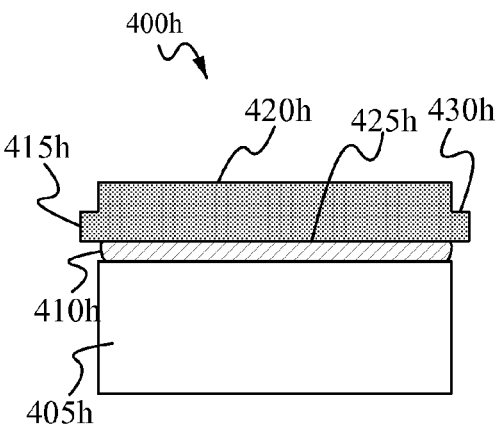
Figure 4I:
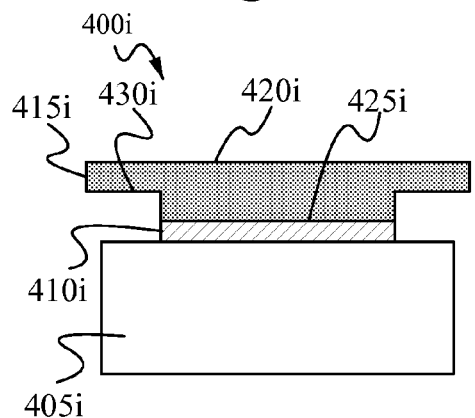
Figure 4J:
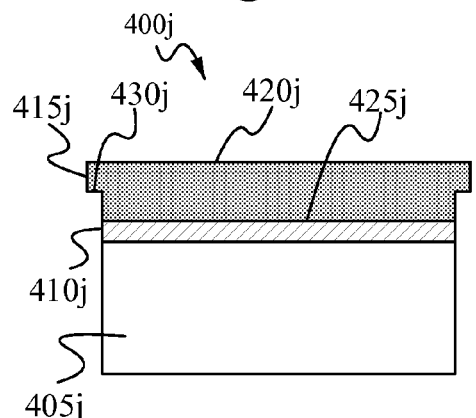
Figures 4K, 4L:
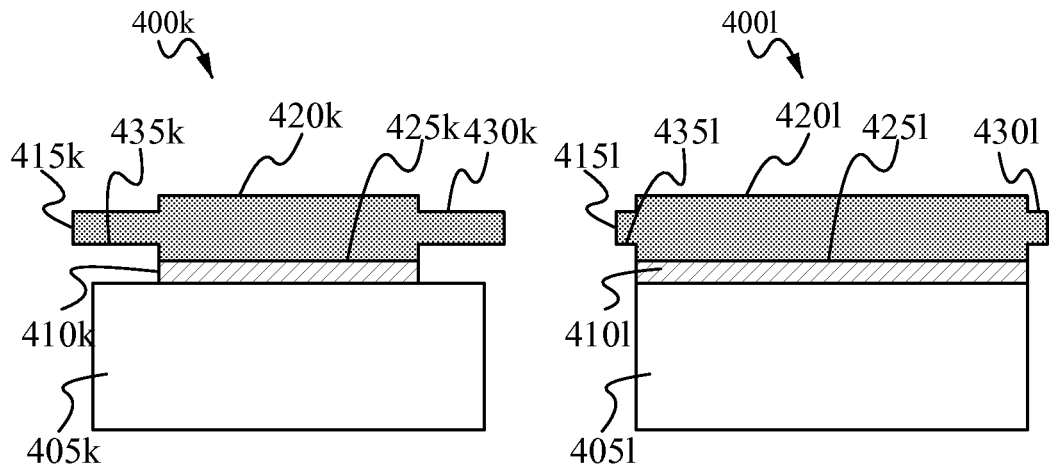
Figure 4M:
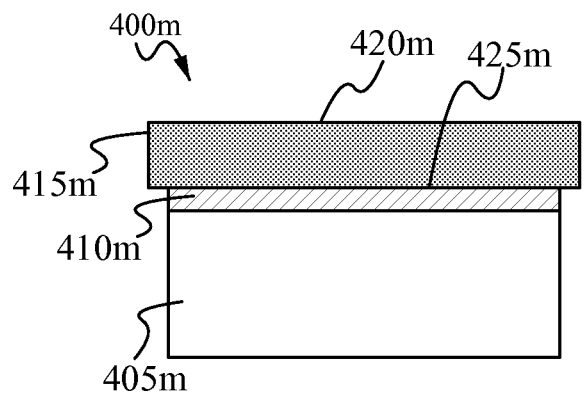
Figure 4N:
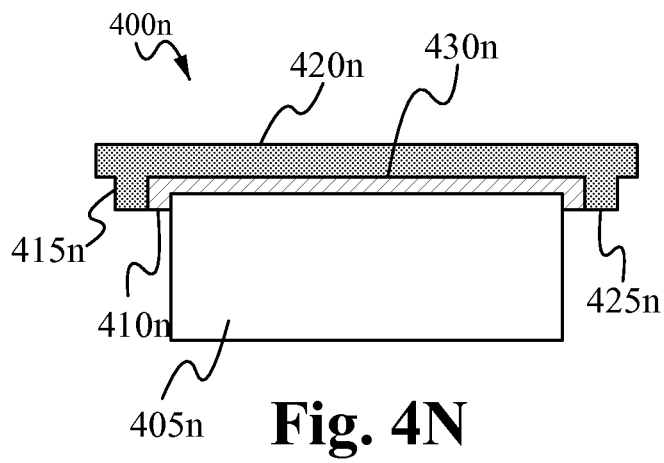

FIGS. 4A-4N illustrate different embodiments of the heat slug pads 415 in accordance with the present invention. As discussed above, the heat slug pads 415 can be etched or stamped to obtain a desired form. In these figures, the heat slug pads 415 are coupled to packages 405 using thermally conductive material 410. For the sake of clarity, the packages 405 are shown as blocks. The packages 405 can be any type of packages, including the previously discussed WLCSPs, FC-QFN packages and WB-QFN packages.

FIG. 4A illustrates a heat slug pad 415a coupled to a package 405a using thermally conductive material 410a. The heat slug pad 415a has an exposed planar surface 420a and an interfacing planar surface 425a. The interfacing planar surface 425a interfaces with the package 405a. The exposed planar surface 420a and the interfacing planar surface 425a of the heat slug pad 415a have the same width as the package 405a. It is intended that other thicknesses can be configured.

FIG. 4B illustrates a heat slug pad 415b coupled to a package 405b using thermally conductive material 410b. The heat slug pad 415b has an exposed planar surface 420b and an interfacing planar surface 425b. The interfacing planar surface 425b interfaces with the package 405b. The exposed planar surface 420b and the interfacing planar surface 425b of the heat slug pad 415b has a smaller width than the package 405b. It is intended that other thicknesses can be configured.

FIG. 4C illustrates a heat slug pad 415c coupled to a package 405c using thermally conductive material 410c. The heat slug pad 415c has an exposed planar surface 420c and an interfacing planar surface 425c. The interfacing planar surface 425c interfaces with the package 405c. The heat slug pad 415c has a second planar surface 430c. The exposed planar surface 420c has a smaller width than the interfacing planar surface 425c. The interfacing planar surface 425c has the same width as or a smaller width than the package 405c. In some embodiments, the thickness from the second planar surface 430c to the interfacing planar surface 425c is half the thickness from the exposed planar surface 420c to the interfacing planar surface 425c. It is intended that other thicknesses can be configured.

FIG. 4D illustrates a heat slug pad 415d coupled to a package 405d using thermally conductive material 410d. The heat slug pad 415d is a flipped embodiment of heat slug pad 415c. In particular, the heat slug pad 415d has an exposed planar surface 420d and an interfacing planar surface 425d. The interfacing planar surface 425d interfaces with the package 405d. The heat slug pad 415d has a second planar surface 430d, which is below the exposed planar surface 420d. The interfacing planar surface 425d has a smaller width than the package 405d. The exposed planar surface 420d has the same width as or a smaller width than the package 405d but larger than the interfacing planar surface 425d. In some embodiments, the thickness from the exposed planar surface 420d to the second planar surface 430d is half the thickness from the exposed planar surface 420d to the interfacing planar surface 425d. It is intended that other thicknesses can be configured.

FIG. 4E illustrates a heat slug pad 415e coupled to a package 405e using thermally conductive material 410e. The heat slug pad 415e has an exposed planar surface 420e and an interfacing planar surface 425e. The interfacing planar surface 425e interfaces with the package 405e. The exposed planar surface 420e has the same width as the interfacing planar surface 425e, both of which have a smaller width than the package 405e. The heat slug pad 415e has a middle section between a second planar surface 430e and a third planar surface 435e. The middle section has a same width as or a smaller width than the package 405e. In some embodiments, the thickness of the middle section is half the thickness from the exposed planar surface 420e to the interfacing planar surface 425e. It is intended that other thicknesses can be configured.

FIG. 4F illustrates a heat slug pad 415f coupled to a package 405f using thermally conductive material 410f. The heat slug pad 415f has a top planar surface 420f, an interfacing planar surface 430f, and a bottom planar surface 425f. The interfacing planar surface 430f interfaces with the package 405f. A center portion of the heat slug pad 415f is removed to create the interfacing planar surface 430f and walls to surround a portion of the package 405f. In some embodiments, the thickness from the top planar surface 420f to the interfacing planar surface 430f is half the thickness from the top planar surface 420f to the bottom planar surface 425f. It is intended that other thicknesses can be configured.

FIG. 4G illustrates a heat slug pad 415g coupled to a package 405g using thermally conductive material 410g. The heat slug pad 415g is similarly configured as the heat slug pad 415c, except that a portion of the heat slug pad 415g extends beyond the edge of the package 405g. In particular, the heat slug pad 415g has an exposed planar surface 420g and an interfacing planar surface 425g. The interfacing planar surface 425g interfaces with the package 405g. The heat slug pad 415g has a second planar surface 430g. The exposed planar surface 420g has a smaller width than the package 405g. The interfacing planar surface 425g has a larger width than the package 405g. In some embodiments, the interfacing planar surface 425g protrudes approximately 0.1 mm to 0.2 mm from the edges of the package 405g. In some embodiments, the thickness from the second planar surface 430g to the interfacing planar surface 425g is half the thickness from the exposed planar surface 420g to the interfacing planar surface 425g. It is intended that other thicknesses can be configured.

FIG. 4H illustrates a heat slug pad 415h coupled to a package 405h using thermally conductive material 410h. The heat slug pad 415h is similarly configured as the heat slug pad 415g, except that an exposed planar surface 420h has a larger width than the exposed planar surface 420g. In particular, the heat slug pad 415h has the exposed planar surface 420h and an interfacing planar surface 425h. The interfacing planar surface 425h interfaces with the package 405h. The heat slug pad 415h has a second planar surface 430h. The exposed planar surface 420h has the same width as the package 405h. The interfacing planar surface 425h has a larger width than the package 405h. In some embodiments, the interfacing planar surface 425h protrudes approximately 0.1 mm to 0.2 mm from the edges of the package 405h. In some embodiments, the thickness from the second planar surface 430h to the interfacing planar surface 425h is half the thickness from the exposed planar surface 420h to the interfacing planar surface 425h. It is intended that other thicknesses can be configured.

FIG. 4I illustrates a heat slug pad 415i coupled to a package 405i using thermally conductive material 410i. The heat slug pad 415i is similarly configured as the heat slug pad 415d, except that a portion of the heat slug pad 415i extends beyond the edge of the package 405i. In particular, the heat slug pad 415i has an exposed planar surface 420i and an interfacing planar surface 425i. The interfacing planar surface 425i interfaces with the package 405i. The heat slug pad 415i has a second planar surface 430i, which is below the exposed planar surface 420i. The interfacing planar surface 425i has a smaller width than the package 405i. The exposed planar surface 420i has a larger width than the package 405i. In some embodiments, the exposed planar surface 420i protrudes approximately 0.1 mm to 0.2 mm from the edges of the package 405i. In some embodiments, the thickness from the exposed planar surface 420i to the second planar surface 430i is half the thickness from the exposed planar surface 420i to the interfacing planar surface 425i. The heat slug pad 415i is a flipped embodiment of heat slug pad 415g. It is intended that other thicknesses can be configured.

FIG. 4J illustrates a heat slug pad 415j coupled to a package 405j using thermally conductive material 410j. The heat slug pad 415j is similarly configured as the heat slug pad 415i, except that an interfacing planar surface 425j has a larger width than the interfacing planar surface 425i. In particular, the heat slug pad 415j has an exposed planar surface 420j and the interfacing planar surface 425j. The interfacing planar surface 425j interfaces with the package 405j. The heat slug pad 415j has a second planar surface 430j, which is below the exposed planar surface 420j. The interfacing planar surface 425j has the same width than the package 405j. The exposed planar surface 420j has a larger width than the package 405j. In some embodiments, the exposed planar surface 420j protrudes approximately 0.1 mm to 0.2 mm from the edges of the package 405j. In some embodiments, the thickness from the exposed planar surface 420j to the second planar surface 430j is half the thickness from the exposed planar surface 420j to the interfacing planar surface 425j. The heat slug pad 415j is a flipped embodiment of heat slug pad 415h. It is intended that other thicknesses can be configured.

FIG. 4K illustrates a heat slug pad 415k coupled to a package 405k using thermally conductive material 410k. The heat slug pad 415k is similarly configured as the heat slug pad 415e, except that a portion of the heat slug pad 415k extends beyond the edge of the package 405k. In particular, heat slug pad 415k has an exposed planar surface 420k and an interfacing planar surface 425k. The interfacing planar surface 425k interfaces with the package 405k. The exposed planar surface 420k has the same width as the interfacing planar surface 425k, both of which have a smaller width than the package 405k. The heat slug pad 415k has a middle section between a second planar surface 430k and a third planar surface 435k. The middle section has a larger width than the package 405k. In some embodiments, the middle section protrudes approximately 0.1 mm to 0.2 mm from the edges of the package 405k. In some embodiments, the thickness of the middle section is half the thickness from the exposed planar surface 420k to the interfacing planar surface 425k. It is intended that other thicknesses can be configured.

FIG. 4L illustrates a heat slug pad 415l coupled to a package 405l using thermally conductive material 410l. The heat slug pad 415l is similarly configured as the heat slug pad 415k, except that an exposed planar surface 420l and an interfacing planar surface 425l have a larger width than the exposed planar surface 420k and the interfacing planar surface 425k, respectively. In particular, heat slug pad 415l has the exposed planar surface 420l and the interfacing planar surface 425l. The interfacing planar surface 425l interfaces with the package 405l. The exposed planar surface 420l has the same width as the interfacing planar surface 425l, both of which have the same width than the package 405l. The heat slug pad 415l has a middle section between a second planar surface 430l and a third planar surface 435l. The middle section has a larger width than the package 405l. In some embodiments, the middle section protrudes approximately 0.1 mm to 0.2 mm from the edges of the package 405l. In some embodiments, the thickness of the middle section is half the thickness from the exposed planar surface 420l to the interfacing planar surface 425l. It is intended that other thicknesses can be configured.

FIG. 4M illustrates a heat slug pad 415m coupled to a package 405m using thermally conductive material 410m. The heat slug pad 415m has an exposed planar surface 420m and an interfacing planar surface 425m. The interfacing planar surface 425m interfaces with the package 405m. The heat slug pad 415m has a larger width than the package 405m. In some embodiments, the heat slug 415m protrudes approximately 0.1 mm to 0.2 mm from the edges of the package 405m. It is intended that other thicknesses can be configured.

FIG. 4N illustrates a heat slug pad 415n coupled to a package 405n using thermally conductive material 410n. The heat slug pad 415n is similarly configured as the heat slug pad 415f, except that a portion of the heat slug pad 415n extends beyond the edge of the package 405n. In particular, the heat slug pad 415n has a top planar surface 420n, an interfacing planar surface 430n, and a bottom planar surface 425n. The interfacing planar surface 430n interfaces with the package 405n. A center portion of the heat slug pad 415n is removed to create the interfacing planar surface 430n and walls to surround a portion of the package 405n. In some embodiments, the thickness from the top planar surface 420n to the interfacing planar surface 430n is half the thickness from the top planar surface 420n to the bottom planar surface 425n. In some embodiments, the top planar surface 420n protrudes approximately 0.1 mm to 0.2 mm from the walls 425n. It is intended that other thicknesses can be configured.

Typically, heat slug pads that have portions that extend beyond the edges of the packages, such as those illustrated in FIGS. 4G-4N, prevent package chips and/or cracks because the protrusions provide for enough spacing between the packages and the singulation device to avoid damage to the packages. These heat slugs are typically larger heat slugs than those in FIGS. 4A-4H. In some embodiments, these larger heat slugs use multiple tie pairs, such as those shown in FIG. 2C.

As discussed above, the heat slug pads can be etched or stamped to obtain a desired form.

Heat Slug Foil

Figure 5A:
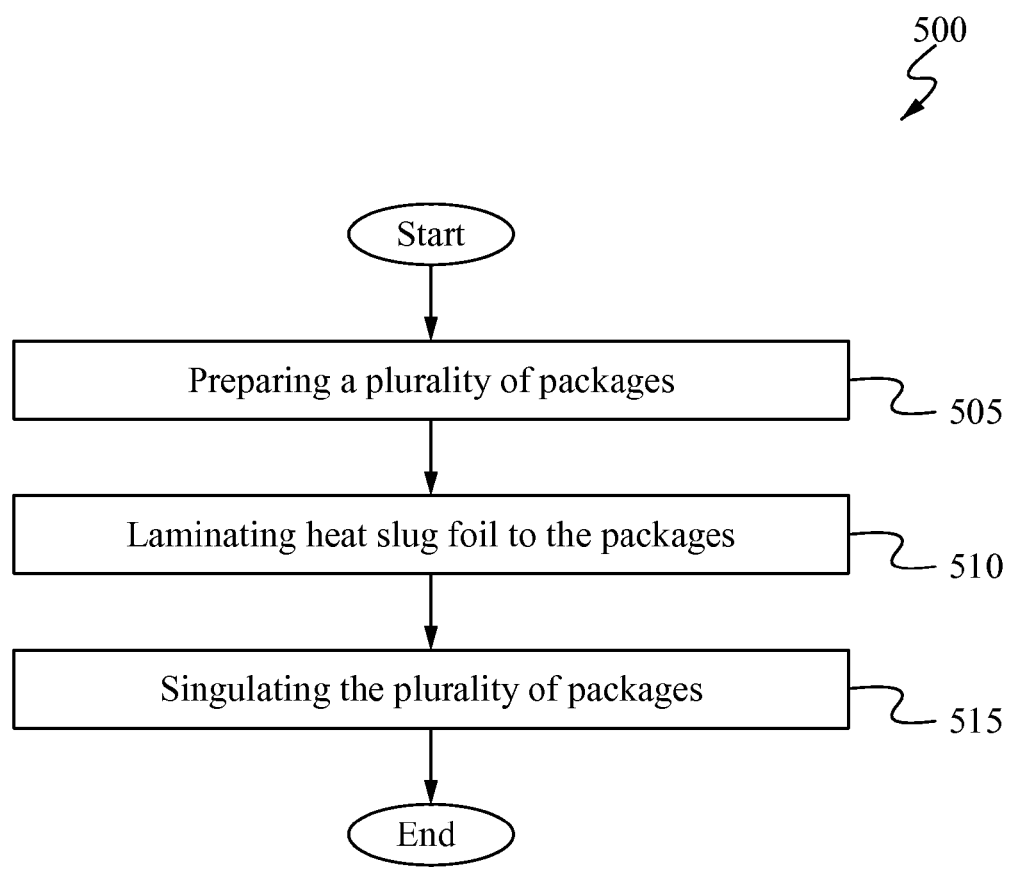
FIG. 5A illustrates a method of attaching heat slug foil to packages in accordance with the present invention.

As mentioned above, some embodiments of a heat slug of the present invention are in the form of one or more foil sheets (collectively "heat slug foil"). FIG. 5A illustrates an embodiment of a method 500 of attaching heat slug foil to packages in accordance with the present invention. The method 500 begins at step 505, wherein a plurality of packages is prepared. Typically, the plurality of packages have not yet been singulated from a wafer, a strip or the like. At step 510, heat slug foil is laminated on one side of the packages using thermally conductive material. Typically, the heat slug foil is made from copper, although other metal alloys are contemplated. At step 515, the plurality of packages is singulated such as via saw singulation, laser singulation or punch singulation. The method 500 then ends.

Figure 5B:
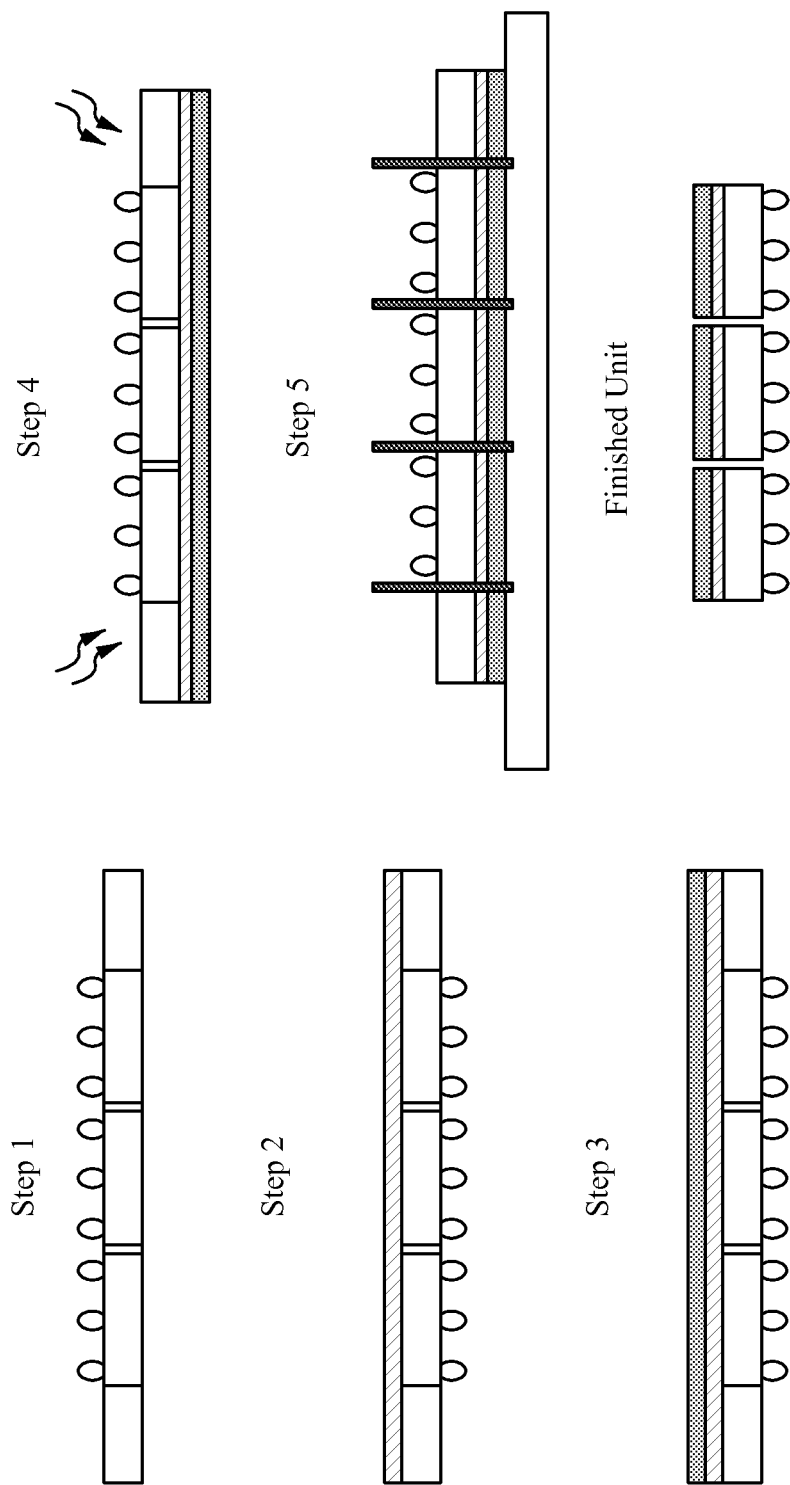
FIG. 5B illustrates a graphical process of producing WLCSPs (wafer level chip scale packages) with attached heat slug pads in accordance with the present invention.

FIG. 5B illustrates an embodiment of a graphical process of producing WLCSPs (wafer level chip scale packages) with attached heat slug pads in accordance with the present invention. At step 1, a wafer of WLCSPs is prepared. At step 2, thermally conductive material is dispensed on the passive side of the wafer. At step 3, heat slug foil is laminated on to the passive side of the wafer using thermally conductive material. At step 4, the thermally conductive material is cured. At step 5, the wafer is diced to produce singulated WLCSPs with attached heat slug pads. As illustrated, a finished unit has a thin layer of heat slug foil coupled to a WLCSP. The width of the heat slug foil is the same as the width of the WLCSP.

Figure 5C:
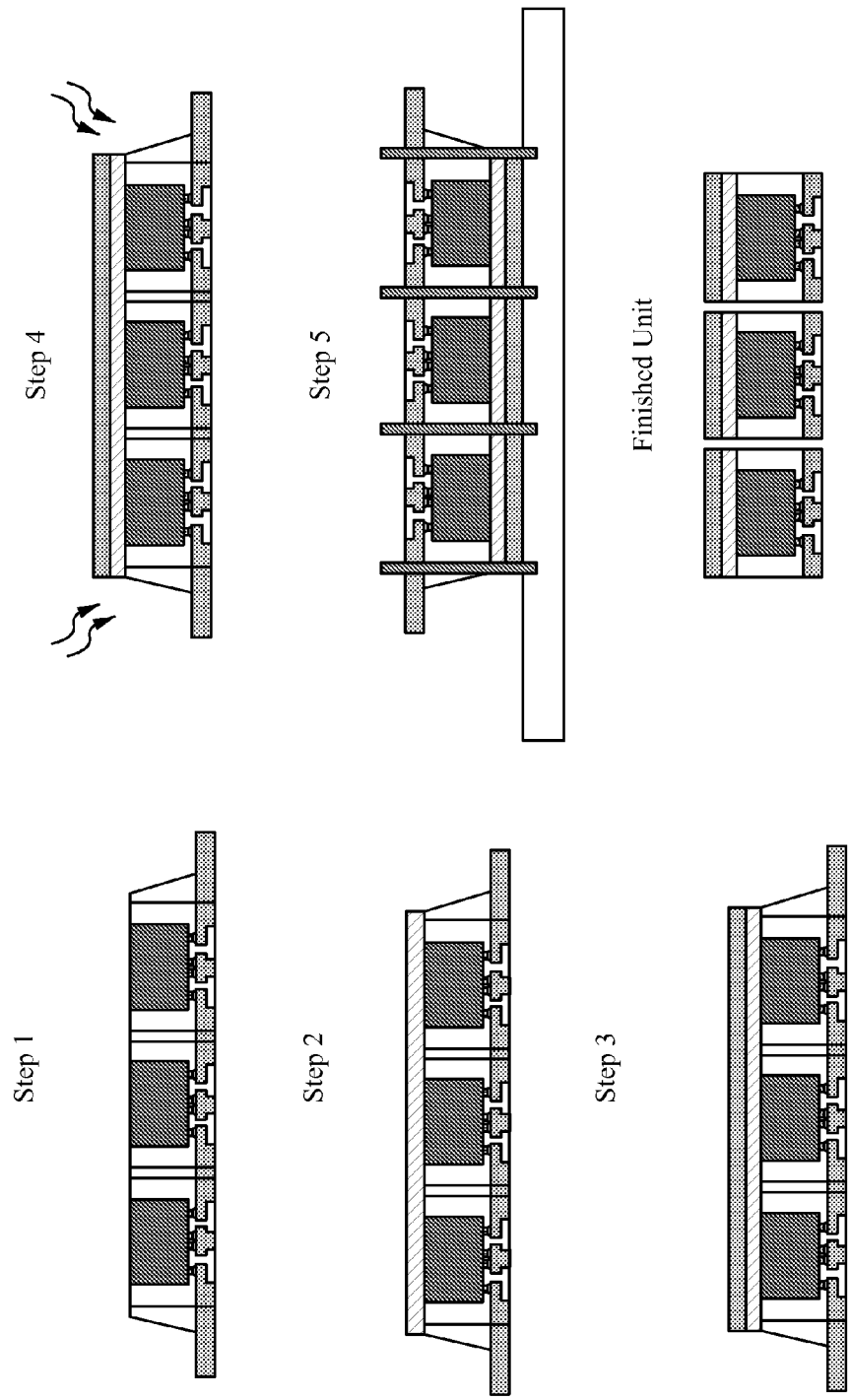
FIG. 5C illustrates a graphical process of producing FC-QFN (flip-chip quad flat non-lead) packages with attached heat slug pads in accordance with the present invention.

FIG. 5C illustrates an embodiment of a graphical process of producing FC-QFN (flip-chip quad flat non-lead) packages with attached heat slug pads in accordance with the present invention. At step 1, a molded strip of FC-QFN packages is prepared. At step 2, thermally conductive material is dispensed on the passive side of the strip. At step 3, heat slug foil is laminated on to the passive side of the strip using thermally conductive material. At step 4, the thermally conductive material is cured. At step 5, the strip is diced to produce singulated FC-QFN packages with attached heat slug pads. As illustrated, a finished unit has a thin layer of heat slug foil coupled to a FC-QFN package. The width of the heat slug foil is the same as the width of the FC-QFN package.

Figure 5D:
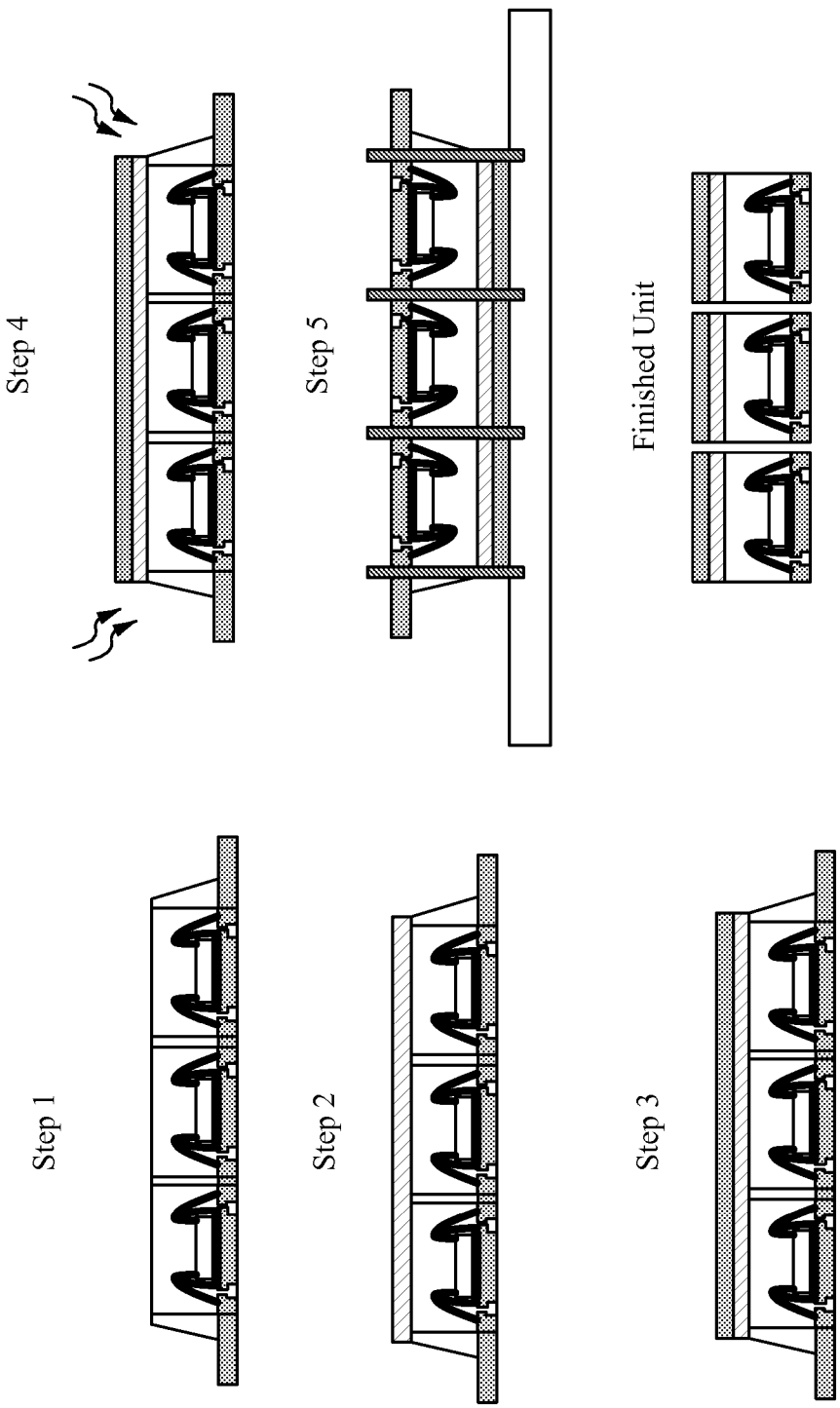
FIG. 5D illustrates a graphical process of producing WB-QFN (wire-bond quad flat non-lead) packages with attached heat slug pads in accordance with the present invention.

FIG. 5D illustrates an embodiment of a graphical process of producing WB-QFN (wire-bond quad flat non-lead) packages with attached heat slug pads in accordance with the present invention. At step 1, a molded strip of WB-QFN packages is prepared. At step 2, thermally conductive material is dispensed on the active side of the strip. At step 3, heat slug foil is laminated on to the active side of the strip using thermally conductive material. At step 4, the thermally conductive material is cured. At step 5, the strip is diced to produce singulated WB-QFN packages with attached heat slug pads. As illustrated, a finished unit has a thin layer of heat slug foil coupled to a WB-QFN package. The width of the heat slug foil is the same as the width of the WB-QFN package.

It is understood by one skilled in the art that the methods 300, 500 of attaching heat slug pads discussed above can be applied to any package, in addition to the above-discussed WLCSPs, FC-QFN packages and WB-QFN packages. FIGS. 6A-6H illustrate representative packages and do not limit the invention in any way. Each package is coupled to a heat slug pad 605 using thermally conductive material 610. For the sake of clarity, the heat slug pads 605 are shown as blocks. The heat slug pads 605 can be any type of heat slug pads (e.g., pad or foil) and any form, including but not limited to those illustrated in FIGS. 4A-4N and 5B-5D.

FIG. 6A illustrates an embodiment of a FC-QFN package 615a coupled to a heat slug pad 605a using thermally conductive material 610a. The package 615a includes a chip 620a, wherein an active side 625a of the chip is coupled to leads 630a and a heat spreader 635a by using solder balls 640a, in a flip chip style. A passive side 645a of the chip is coupled to a die pad 650a using an adhesive 655a. A heat-conductive and electrically insulated material is a preferred one for the adhesive 655a. The die pad 650a is typically a thermally conductive layer made from copper, silicon or any suitable material. The area of the contact interface of the die pad 650a is smaller than the area of the passive side 645a. The area of the exposed surface of the die pad 650a is greater than the area of the contact interface of the die pad 650a. Preferably, heat accumulated on the chip 620a is dissipated to the die pad 650a and the heat spreader 635a. The molding compound 660a encapsulates the chip 620a, the die pad 650a, the leads 630a and the heat spreader 635a to form the package 615a.

FIG. 6B illustrates another embodiment of a FC-QFN package 615b coupled to a heat slug pad 605b using thermally conductive material 610b. The FC-QFN package 615b is similarly configured as FC-QFN package 615a, except that the width of the die pad 650b is smaller than that of the chip 620b.

FIG. 6C illustrates yet another embodiment of a FC-QFN package 615c coupled to a heat slug pad 605c using thermally conductive material 610c. The FC-QFN package 615c is similarly configured as FC-QFN package 615b, except that the width of the die pad 650c is the same as or smaller than that of the chip 620c.

FIG. 6D illustrates yet another embodiment of a FC-QFN package 615d coupled to a heat slug pad 605d using thermally conductive material 610d. The FC-QFN package 615d is similarly configured as FC-QFN package 615c, except that the width of the die pad 650d is the same as the width of the package 615d.

FIG. 6E illustrates an embodiment of a WB-QFN package 615e coupled to a heat slug pad 605e using thermally conductive material 610e. The package 615e includes a chip 620e, wherein a passive side 625e of the chip 620e is coupled to a heat spreader 630e using an adhesive 635e. An active side 640e of the chip 620e has a plurality of bonding pads (not illustrated) for external connections of the chip 620e. The active side 640e is coupled to a die pad 645e using an adhesive 650e. A heat-conductive and electrically insulated material is a preferred one for the adhesive 635e, 650e. The die pad 645e is typically a thermally conductive layer made from copper, silicon or any suitable material. The area of the contact interface of the die pad 645e is smaller than the area of the active side 640e, exposing the bonding pads. The area of the exposed surface of the die pad 645e is greater than the area of the active side 640e to maximize the surface area exposed at the top of the package 615e. Preferably, heat accumulated on the chip 620e is dissipated to the die pad 645e and the heat spreader 630e. The bonding pads are electrically coupled to leads 655e by bonding wires 660e. The bonding wires 660e are made from gold, aluminum, or any suitable material. The molding compound 660e encapsulates the chip 620e, the die pad 645e, the leads 655e, the heat spreader 630e and the bonding wires 660e to form the package 615e.

FIG. 6F illustrates another embodiment of a WB-QFN package 615f coupled to a heat slug pad 605f using thermally conductive material 610f. The WB-QFN package 615f is similarly configured as WB-QFN package 615e, except that the width of the die pad 645f is smaller than that of the chip 620f.

FIG. 6G illustrates yet another embodiment of a WB-QFN package 615g coupled to a heat slug pad 605g using thermally conductive material 610g. The WB-QFN package 615g is similarly configured as WB-QFN package 615f, except that the width of the die pad 645g is greater than that of the chip 620f but smaller than that of the package 615g.

FIG. 6H illustrates yet another embodiment of a WB-QFN package 615h coupled to a heat slug pad 605h using thermally conductive material 610h. The WB-QFN package 615h is similarly configured as WB-QFN package 615g, except that the width of the die pad 645h is the same as the width of the package 615h.

As discussed above, the packages illustrated in FIG. 6A-6H are only exemplary and do not limit the invention in any way. Other packages, such as those described in U.S. patent application Ser. No. 11/899,189, filed Sep. 4, 2007, entitled "PACKAGE WITH HEAT TRANSFER," which is hereby incorporated by reference in its entirety, are also contemplated.

While the invention has been described with reference to numerous specific details, one of ordinary skill in the art will recognize that the invention can be embodied in other specific forms without departing from the spirit of the invention. Thus, one of ordinary skill in the art will understand that the invention is not to be limited by the foregoing illustrative details, but rather is to be defined by the appended claims.

What is claimed is:

1. A method of attaching heat slug pads to packages, the method comprising:
gathering a plurality of packages, wherein each of the plurality of packages is a singulated package;
preparing a heat slug frame including a N×M matrix of heat slug pads coupled together, wherein the preparing step includes coupling each heat slug pad to another heat slug pad using two or more tie bars;
dispensing thermally conductive material onto surfaces of the heat slug pads;
attaching the plurality of packages onto the heat slug pads; and
singulating the heat slug pads to form individual finished products, wherein each of the individual finished products includes a heat slug pad coupled with a singulated package, wherein the singulating step consists of one or more passes across the N×M matrix, wherein the one or more passes are parallel.

2. The method of claim 1, wherein the gathering step includes singulating the plurality of packages.

3. The method of claim 1, wherein the preparing step includes forming the heat slug pads by one of etching and stamping.

4. The method of claim 3, wherein the forming step results in each heat slug pad including a protrusion along a portion of the heat slug pad.

5. The method of claim 4, wherein the protrusion extends between 0.1 mm and 0.2 mm from an edge of a package coupled to the heat slug.

6. The method of claim 3, wherein the forming step results in each heat slug pad including at least two walls to position a package therebetween when the package is coupled to the heat slug.

7. The method of claim 3, wherein at least a portion of the heat slug pad is half the total thickness of the heat slug pad.

8. The method of claim 1, wherein the preparing step includes marking the heat slug pads with fiducial alignment marks.

9. The method of claim 1, wherein each heat slug pad has two or more tie bars on each non-adjacent side of the heat slug pad.

10. The method of claim 1, wherein the preparing step further includes etching the two or more tie bars.

11. The method of claim 1, wherein the preparing step further includes stamping the two or more tie bars.

12. The method of claim 1, wherein the attaching step includes aligning the plurality of packages to the heat slug pads according to fiducial alignment marks on the heat slug pads.

13. The method of claim 1, further comprising, after the attaching step, curing the thermally conductive material.

14. The method of claim 1, wherein the plurality of packages are wafer level chip scale packages.

15. The method of claim 1, wherein the plurality of packages are flip-chip quad flat non-lead packages.

16. The method of claim 1, wherein the plurality of packages are wire-bond quad flat non-lead packages.

17. A method of attaching heat slug foil to packages, the method comprising:
preparing a plurality of packages;
laminating the heat slug foil to one side of the plurality of packages using thermally conductive material, wherein the packages are not singulated from a wafer prior to the lamination of the heat slug foil, wherein the laminating step includes dispensing the thermally conductive material on a passive side of the wafer; and
singulating the plurality of packages from the wafer.

18. The method of claim 17, further comprising, after the laminating step, curing the thermally conductive material.

19. The method of claim 17, wherein the plurality of singulated packages are wafer level chip scale packages.

20. The method of claim 17, wherein the plurality of singulated packages are flip-chip quad flat non-lead packages.

21. The method of claim 17, wherein the plurality of singulated packages are wire-bond quad flat non-lead packages.

22. The method of claim 1, wherein at least one of the heat slug pads has varying thickness across the at least one of the heat slug pads.

23. The method of claim 17, wherein the heat slug foil is substantially planar and has a uniform thickness.

24. The method of claim 17, wherein the heat slug foil is a thin sheet of metal configured to dissipate heat.

25. The method of claim 17, wherein in the preparation of the plurality of packages, the plurality of packages have not yet been singulated from a wafer.

26. A method of attaching heat slug pads to packages, the method comprising:
gathering a plurality of packages, wherein each of the plurality of packages is a singulated package;
preparing a heat slug frame including a N×M matrix of heat slug pads coupled together;
dispensing thermally conductive material onto surfaces of the heat slug pads;

attaching the plurality of packages onto the heat slug pads, wherein the attaching step includes picking up each of the plurality of packages and coupling one of the heat slug pads therewith; and singulating the heat slug pads to form individual finished products, wherein each of the individual finished products includes a heat slug pad coupled with a singulated package, wherein the singulating step consists of one or more passes across the N×M matrix, wherein the one or more passes are parallel.

27. A method of attaching heat slug pads to packages, the method comprising:

gathering a plurality of packages, wherein each of the plurality of packages is a singulated package;

preparing a heat slug frame including a N×M matrix of heat slug pads coupled together, wherein the preparing step includes coupling each heat slug pad to another heat slug pad using two or more tie bars, wherein each heat slug pad has two or more tie bars on each non-adjacent side of the heat slug pad;

dispensing thermally conductive material onto surfaces of the heat slug pads;

attaching the plurality of packages onto the heat slug pads; and singulating the heat slug pads to form individual finished products, wherein each of the individual finished products includes a heat slug pad coupled with a singulated package, wherein the singulating step consists of one or more passes across the N×M matrix, wherein the one or more passes are parallel.

* * * * *